US010892308B2

(12) United States Patent
Son et al.

(10) Patent No.: US 10,892,308 B2
(45) Date of Patent: *Jan. 12, 2021

(54) DISPLAY PANEL AND METHOD OF FABRICATING THE SAME

(71) Applicant: Samsung Display Co., Ltd., Yongin-Si (KR)

(72) Inventors: Kyoungseok Son, Seoul (KR); Myounghwa Kim, Seoul (KR); Eoksu Kim, Seoul (KR); Taesang Kim, Seoul (KR); Masataka Kano, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/789,107

(22) Filed: Feb. 12, 2020

(65) Prior Publication Data

US 2020/0185473 A1    Jun. 11, 2020

Related U.S. Application Data

(63) Continuation of application No. 16/133,404, filed on Sep. 17, 2018, now Pat. No. 10,593,739.

(30) Foreign Application Priority Data

Dec. 8, 2017    (KR) ........................ 10-2017-0168681

(51) Int. Cl.
*H01L 27/32*    (2006.01)
*H01L 51/56*    (2006.01)
(Continued)

(52) U.S. Cl.
CPC ........ *H01L 27/3246* (2013.01); *H01L 27/124* (2013.01); *H01L 27/1225* (2013.01);
(Continued)

(58) Field of Classification Search
CPC ............. H01L 27/3246; H01L 27/3258; H01L 27/1288; H01L 51/0097; H01L 27/3276;
(Continued)

(56) References Cited

U.S. PATENT DOCUMENTS 9,129,927 B2     9/2015  Gupta et al.
10,593,739 B2 *  3/2020  Son ..................... H01L 27/3262
(Continued)

FOREIGN PATENT DOCUMENTS

EP    3217265 A1    9/2017
EP    3236309 A1    10/2017
(Continued)

OTHER PUBLICATIONS

European Search Report corresponding to European Patent Application No. 18211182.3 dated Apr. 23, 2019 9 pages.

*Primary Examiner* — Vu A Vu

(74) *Attorney, Agent, or Firm* — Innovation Counsel LLP

(57) ABSTRACT

A method of fabricating a display panel may include forming an oxide semiconductor pattern on a base layer including a first region and a second region, etching first, second, and third insulating layers to form a first groove that overlaps the second region, forming electrodes on the third insulating layer, forming a fourth insulating layer on the third insulating layer to cover the electrodes, thermally treating the fourth insulating layer, forming an organic layer to cover the fourth insulating layer, and forming an organic light emitting diode on the organic layer.

10 Claims, 33 Drawing Sheets

(51) Int. Cl.
  *H01L 51/52* (2006.01)
  *H01L 51/00* (2006.01)
  *H01L 27/12* (2006.01)
  *H01L 51/50* (2006.01)

(52) U.S. Cl.
  CPC ...... *H01L 27/1288* (2013.01); *H01L 27/3248* (2013.01); *H01L 27/3258* (2013.01); *H01L 27/3262* (2013.01); *H01L 27/3276* (2013.01); *H01L 51/0097* (2013.01); *H01L 51/5012* (2013.01); *H01L 51/5253* (2013.01); *H01L 51/56* (2013.01); *H01L 2227/323* (2013.01); *H01L 2251/5338* (2013.01)

(58) Field of Classification Search
  CPC . H01L 51/5012; H01L 51/56; H01L 27/3248; H01L 27/124; H01L 51/5253; H01L 27/3262; H01L 27/1225; H01L 2251/5338; H01L 2227/323

USPC .......................................................... 257/40
See application file for complete search history.

(56) References Cited

U.S. PATENT DOCUMENTS

| | | |
|---|---|---|
| 2012/0187399 A1 | 7/2012 | Fukuda et al. |
| 2014/0217373 A1 | 8/2014 | Youn et al. |
| 2016/0087022 A1 | 3/2016 | Tsai et al. |
| 2016/0148983 A1 | 5/2016 | Cha et al. |
| 2017/0062760 A1 | 3/2017 | Kim |
| 2018/0033849 A1* | 2/2018 | Noh ................... H01L 27/1222 |

FOREIGN PATENT DOCUMENTS

| | | |
|---|---|---|
| KR | 10-1561802 B1 | 10/2015 |
| KR | 10-2017-0020626 A | 2/2017 |
| KR | 10-2017-0024200 | 3/2017 |

* cited by examiner

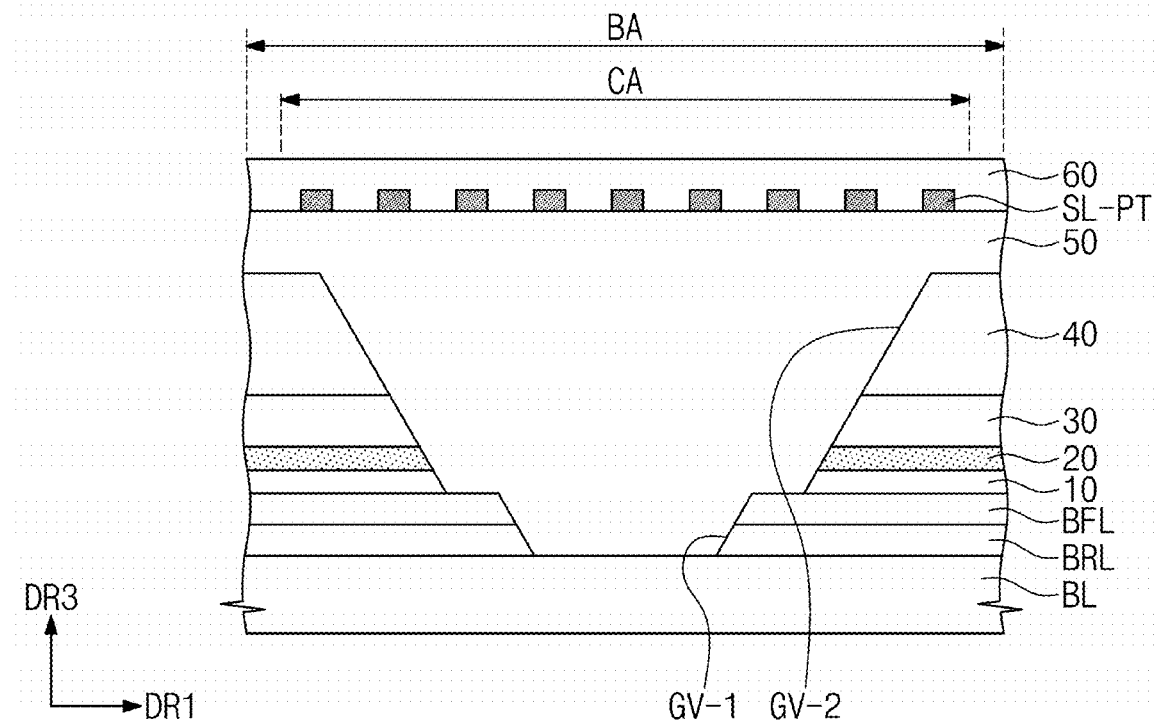

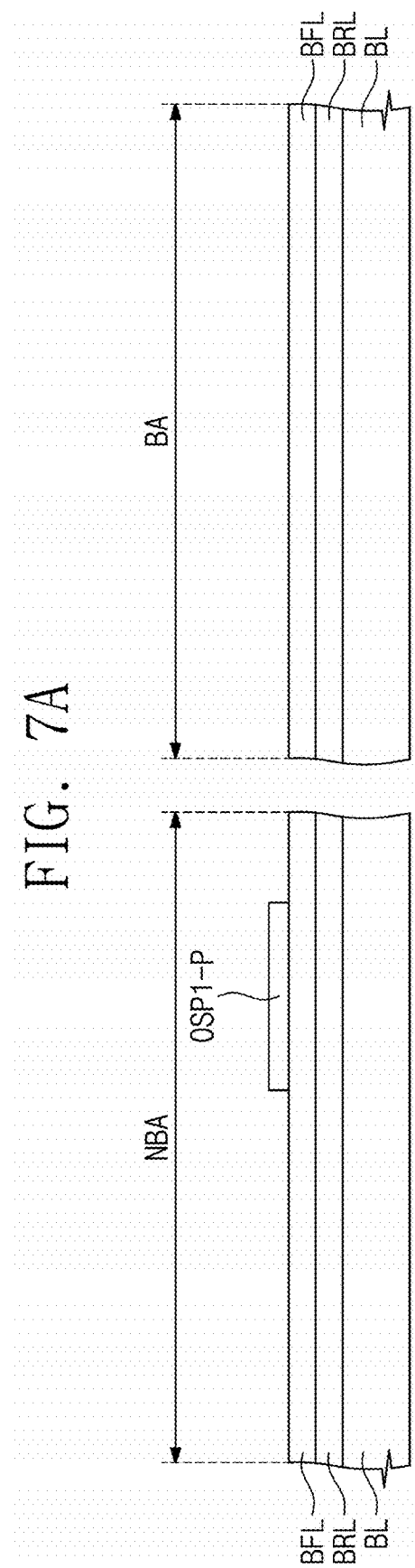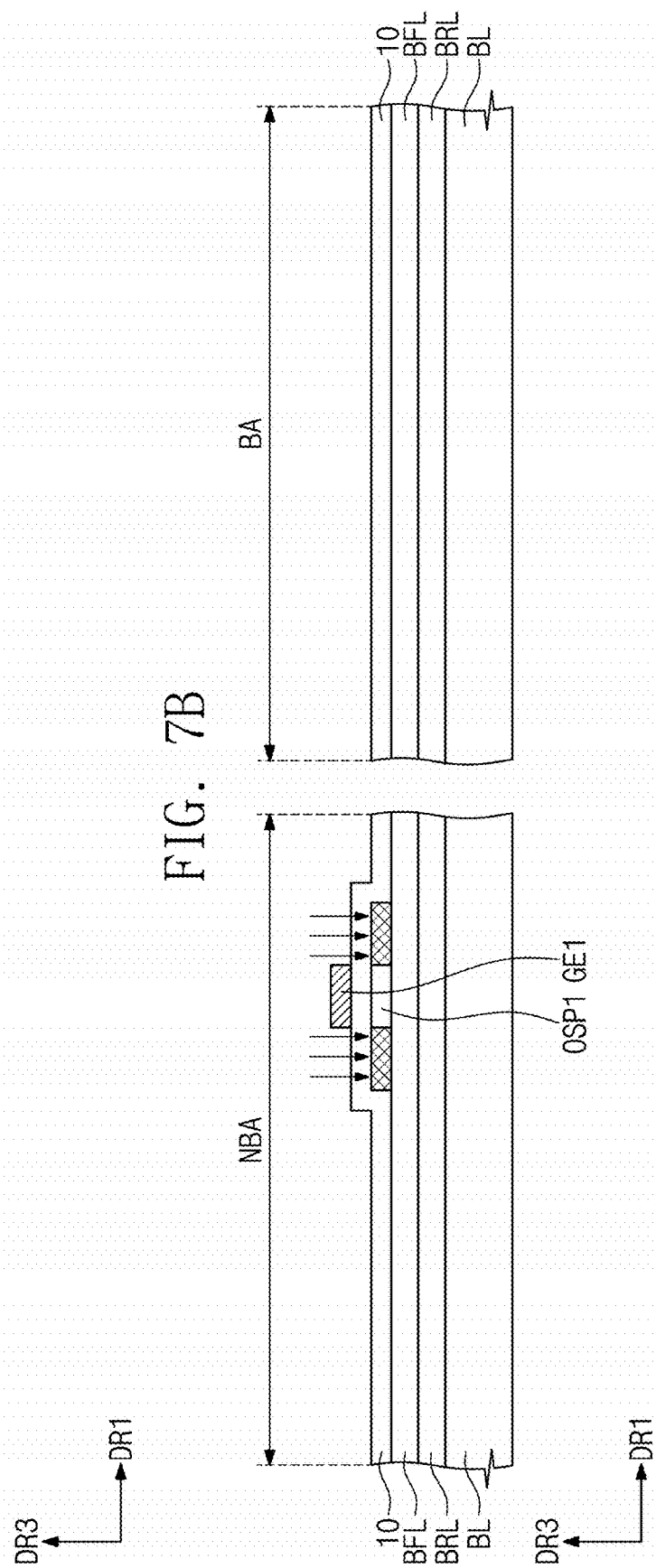

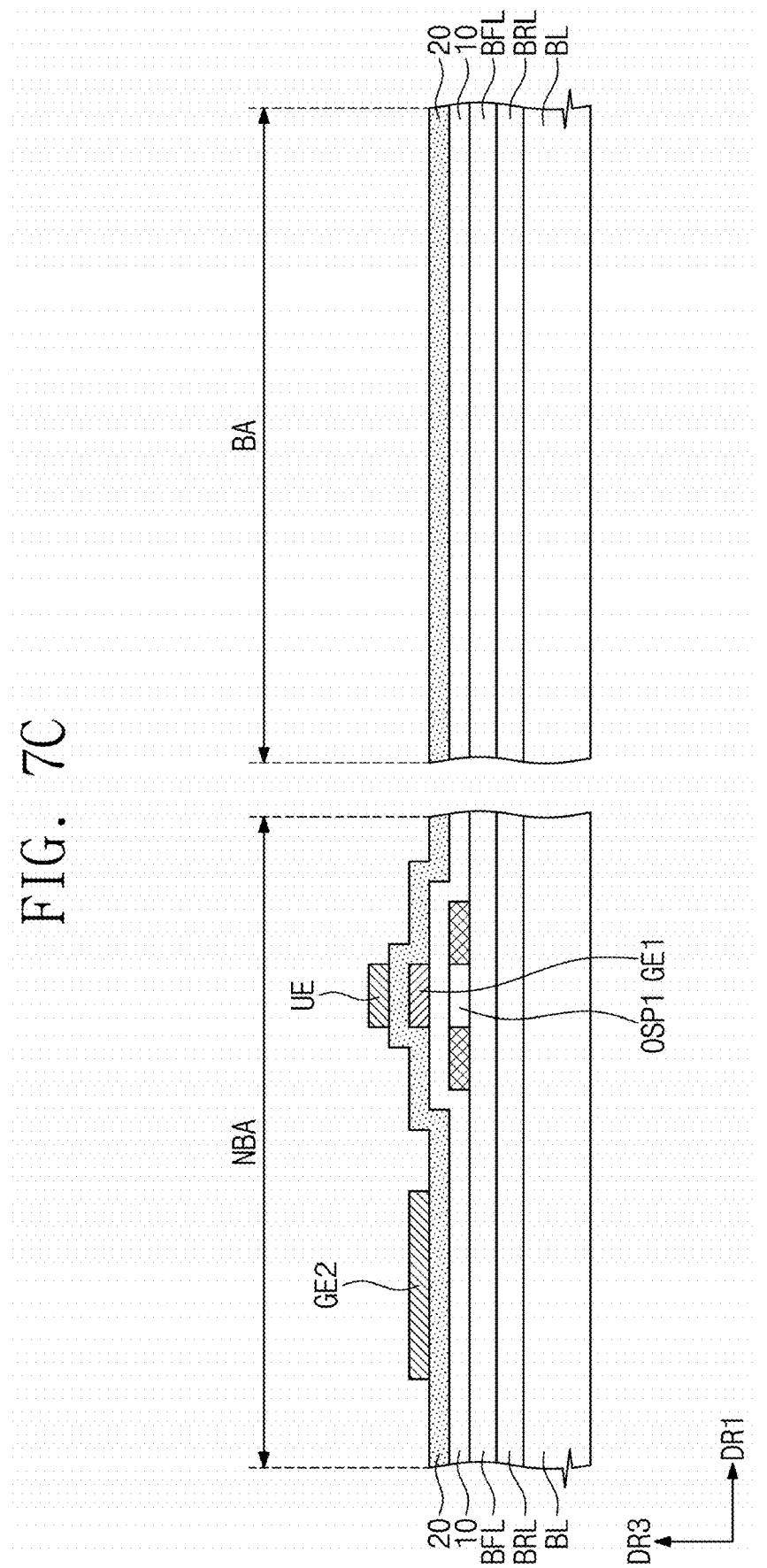

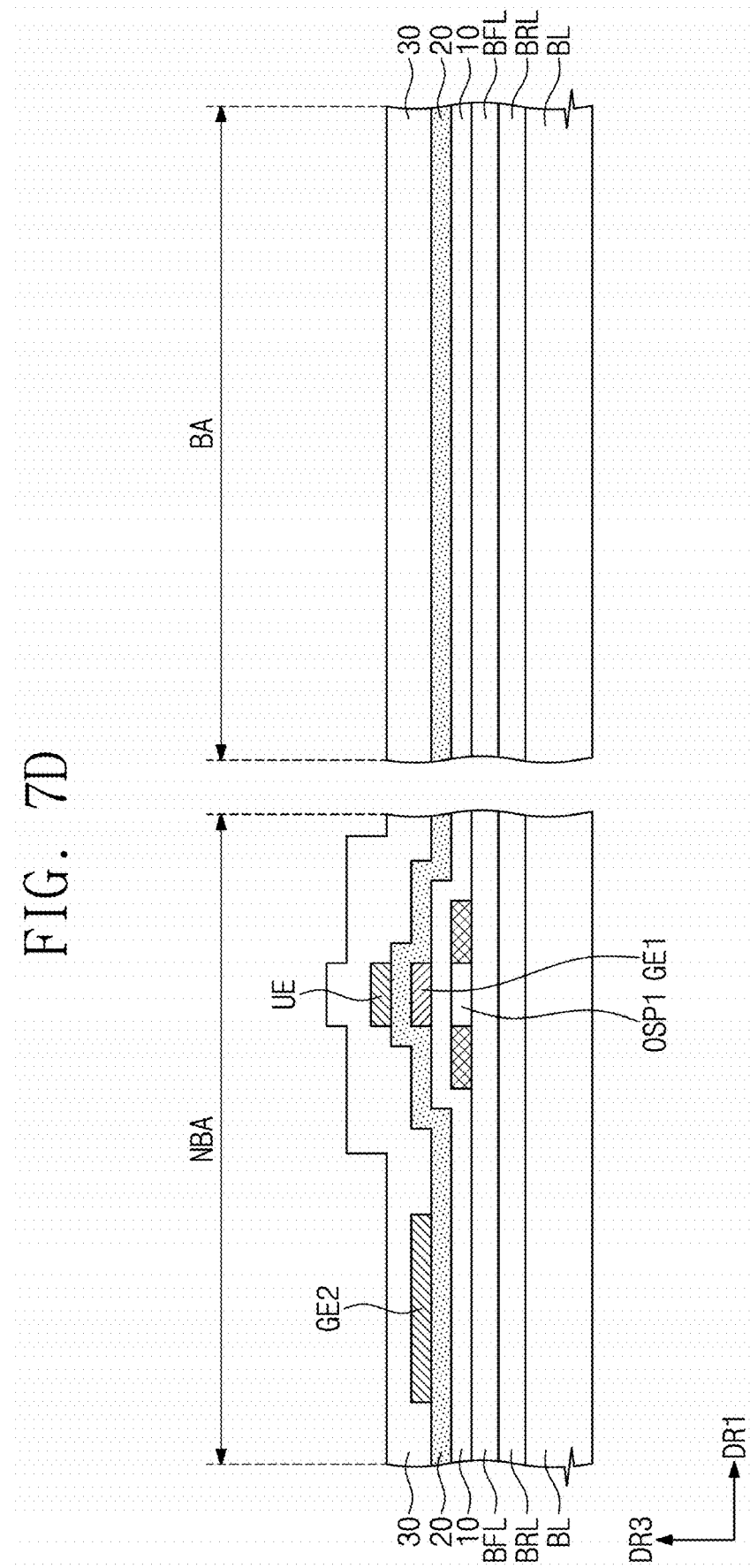

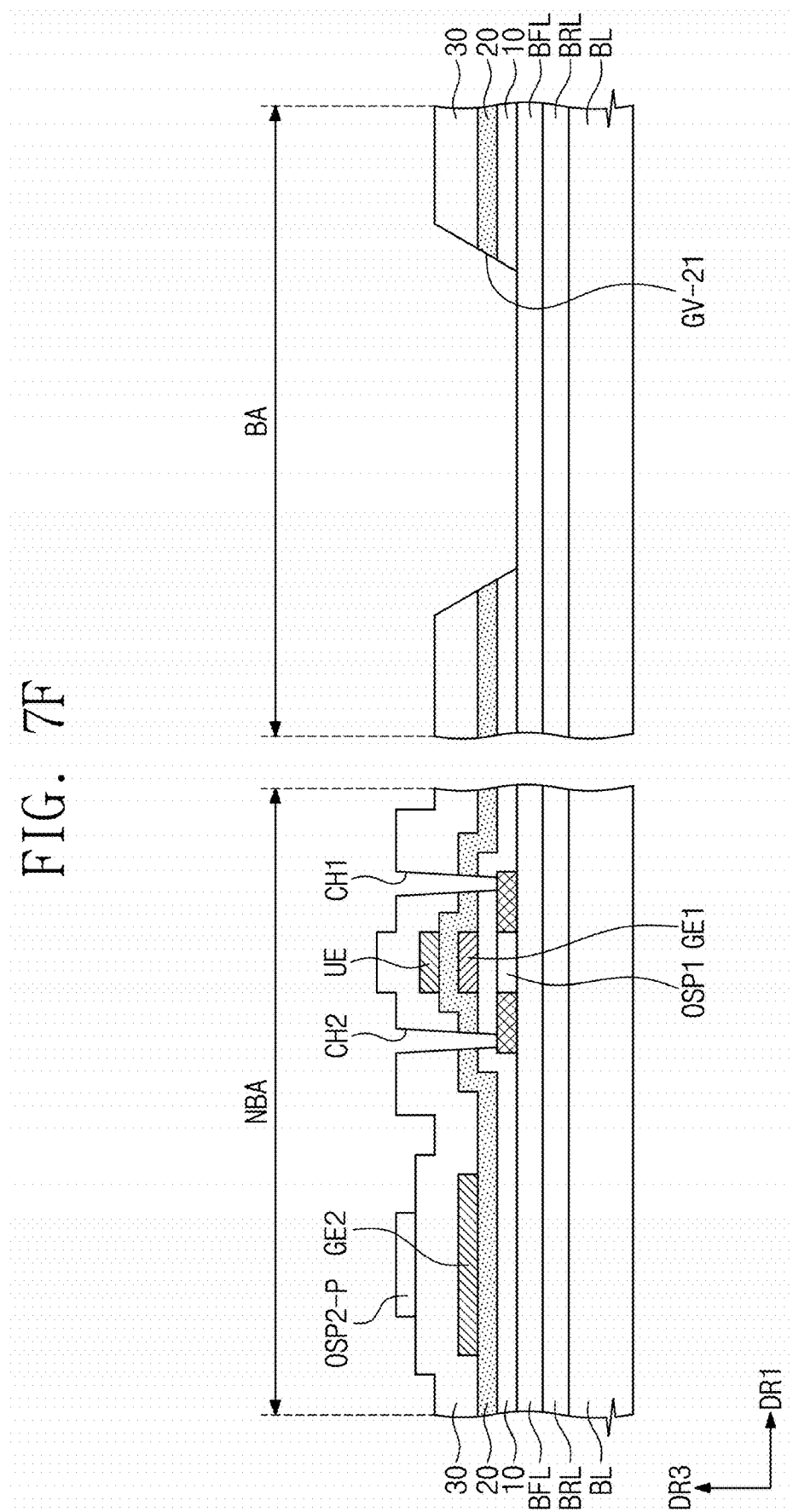

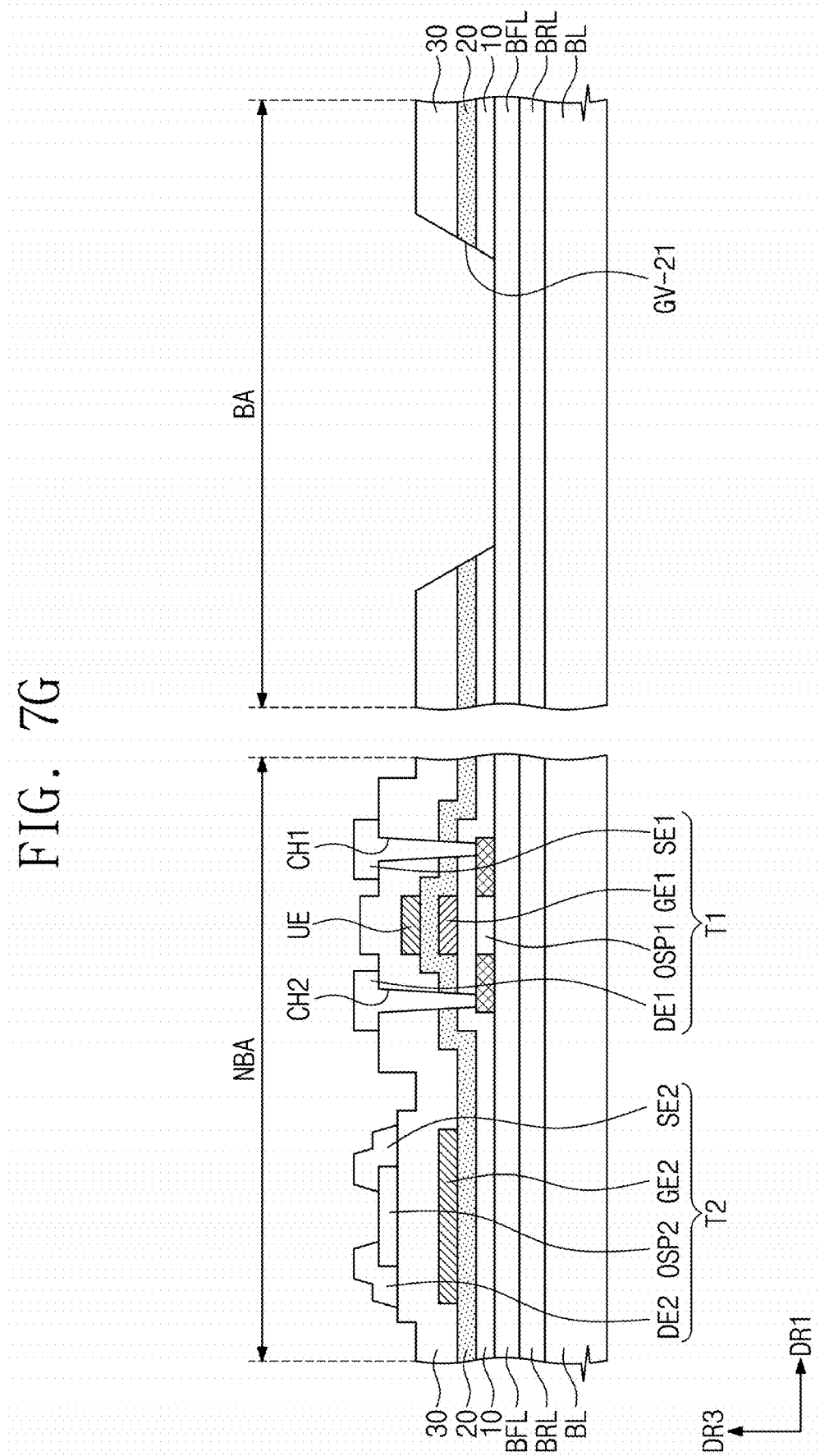

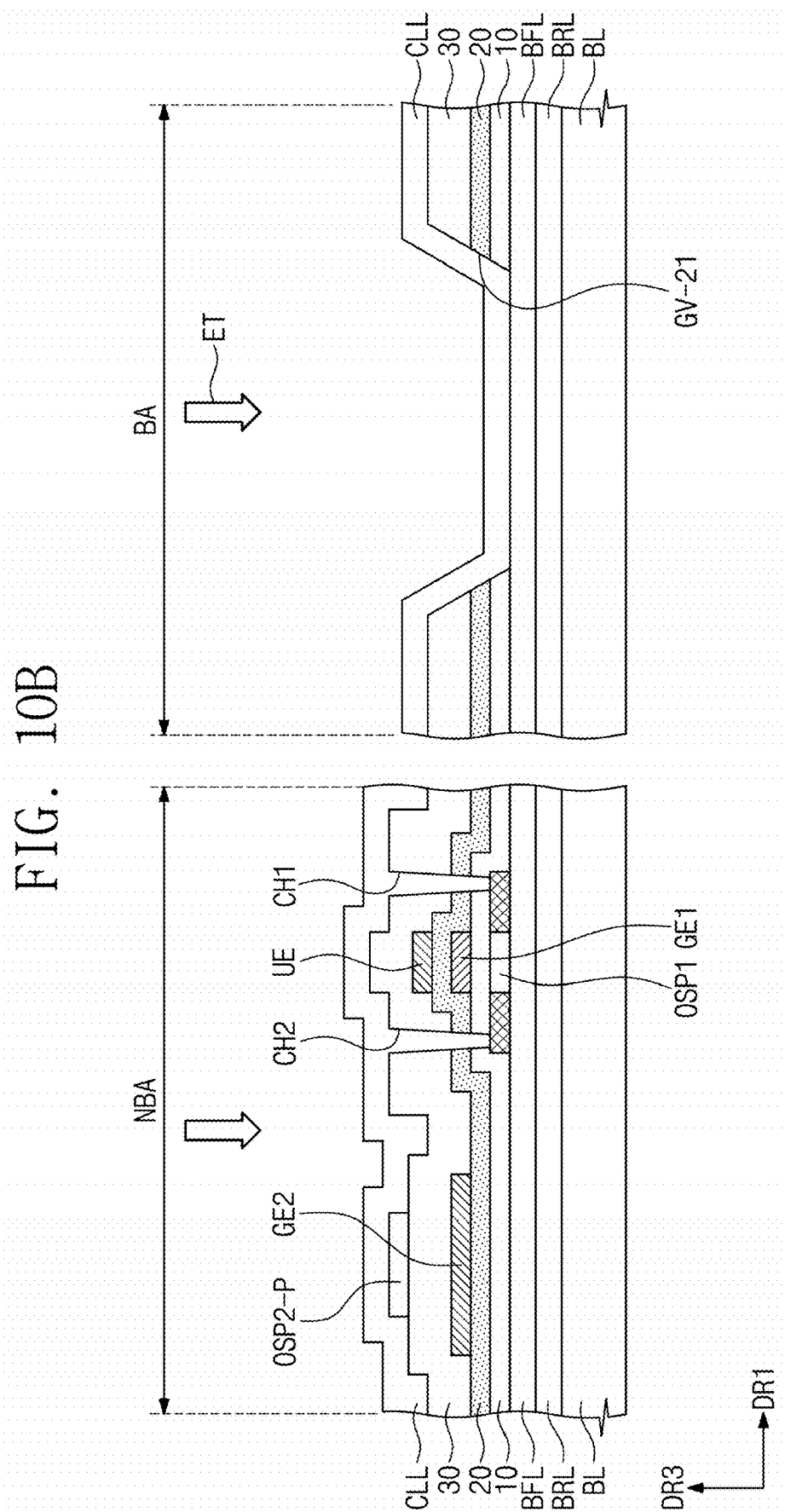

DISPLAY PANEL AND METHOD OF FABRICATING THE SAME

CROSS-REFERENCE TO RELATED APPLICATIONS

This application is a continuation application of U.S. patent application Ser. No. 16/133,404 filed on Sep. 17, 2018, which claims priority under 35 USC § 119 to Korean Patent Application No. 10-2017-0168681, filed on Dec. 8, 2017, in the Korean Intellectual Property Office, the disclosures of which are incorporated herein in their entirety by reference.

BACKGROUND OF THE INVENTION

The present disclosure relates to a display panel and a method of fabricating the same, and in particular, to a highly reliable display panel and a method of fabricating the same.

A display panel includes a plurality of pixels and a driving circuit for controlling the pixels. The driving circuit of the display panel is configured to provide electrical control signals to the pixels.

Each of the pixels includes a pixel driving circuit and a display device such as an organic light emitting diode (OLED) or a quantum-dot light-emitting diode that is connected to the pixel driving circuit. The pixel driving circuit includes at least one thin-film transistor and a capacitor. The thin-film transistor and the capacitor of the pixel driving circuit control the display device based on the electrical signals received from one or more driving circuits of the display panel. According to required electric characteristics, the pixel driving circuit may be configured to include two or more thin-film transistors containing at least two different semiconductor materials and properties. The pixel driving circuit including two or more thin-film transistors may drive the pixel in a more stable, more reliable manner.

SUMMARY

An embodiment of the inventive concept provides a method of stably fabricating a display panel.

An embodiment of the inventive concept provides a highly-reliable display panel.

According to an embodiment of the inventive concept, a method of fabricating a display panel may include forming a silicon semiconductor pattern on a base layer including a first region and a second region that is extended from the first region, the silicon semiconductor pattern overlapping the first region, forming a first control electrode on the silicon semiconductor pattern, the first control electrode overlapping the silicon semiconductor pattern with a first insulating layer interposed therebetween, forming a second control electrode to overlap the first region and to be spaced apart from the first control electrode with a second insulating layer interposed therebetween, forming an oxide semiconductor pattern on the second control electrode to overlap the second control electrode with a third insulating layer interposed therebetween, etching the first, second, and third insulating layers to form a first contact hole and a second contact hole exposing at least a portion of the silicon semiconductor pattern and a first groove that overlaps the second region, forming on the third insulating layer a first input electrode and a first output electrode that are connected to the silicon semiconductor pattern through the first and second contact holes, and a second input electrode and a second output electrode that are connected to the oxide semiconductor pattern, forming a fourth insulating layer on the third insulating layer to cover the first input electrode, the first output electrode, the second input electrode, and the second output electrode, thermally treating the fourth insulating layer, forming on the organic layer an organic layer to cover the fourth insulating layer, and forming an organic light emitting diode that is connected to the first output electrode.

In an embodiment, the thermal treating of the fourth insulating layer may be performed at a temperature of about 300° C. or higher.

In an embodiment, the organic layer may include polyimide.

In an embodiment, the etching of the first, second, and third insulating layers may be performed to simultaneously form the first and second contact holes and the first groove using a single mask.

In an embodiment, the method may further include forming a second groove that overlaps the first groove in the fourth insulating layer after the forming of the fourth insulating layer. The organic layer may be formed to fill the first groove and the second groove.

In an embodiment, the method may further include forming an inorganic layer between the first insulating layer and the base layer. The forming of the second groove may include forming a third groove that overlaps the first groove in the inorganic layer.

In an embodiment, the method may further include forming a third contact hole in the organic layer to expose a portion of the first output electrode, forming a connection electrode on the organic layer to be connected to the first output electrode through the third contact hole, and forming an upper organic layer on the organic layer to cover the connection electrode. The organic light emitting diode may be connected to the connection electrode through the upper organic layer.

In an embodiment, the connection electrode may be formed of a material that is different from the first output electrode.

In an embodiment, the connection electrode may be formed of a material whose resistance is lower than that of the first output electrode.

In an embodiment, the forming of the first input electrode, the first output electrode, the second input electrode, and the second output electrode may include forming a conductive layer on the third insulating layer to cover the oxide semiconductor pattern and patterning the conductive layer using an etching gas. The etching gas may contain a fluoro compound.

In an embodiment, the conductive layer may have a higher etch rate than the oxide semiconductor pattern in the patterning of the conductive layer using the etching gas.

According to an embodiment of the inventive concept, a display panel may include a base layer including a first region and a second region that are bent from the first region around a specific bending axis, a first thin-film transistor disposed in the first region, the first thin-film transistor including a crystalline silicon semiconductor pattern, a first control electrode, and a first input electrode and a first output electrode that are coupled to the crystalline silicon semiconductor pattern and are spaced apart from each other with the first control electrode interposed therebetween, a second thin-film transistor disposed in the first region to have a bottom gate structure, the second thin-film transistor including a second control electrode, an oxide semiconductor pattern disposed on the second control electrode, and a second input electrode and a second output electrode that are in contact with the oxide semiconductor pattern and are spaced apart from each other, a passivation layer disposed in the first region and the second region to cover the first thin-film transistor and the second thin-film transistor and to include a first groove that overlaps the second region, a plurality of inorganic layers disposed between the passivation layer and the base layer to include a second groove that overlaps the first groove, an organic layer disposed in the first region and the second region and on the passivation layer to cover inner surfaces of the first and second grooves, and an organic light emitting diode disposed on the organic layer and in the first region and electrically connected to the first thin-film transistor. Etch rates of the second input electrode and the second output electrode that are etched by a fluoro compound may be higher than that of the oxide semiconductor pattern.

In an embodiment, the second input electrode and the second output electrode may include molybdenum.

In an embodiment, the display panel may further include an upper organic layer disposed between the organic layer and the organic light emitting diode, and a connection electrode disposed between the upper organic layer and the organic layer and coupled to each of the organic light emitting diode and the first output electrode. The connection electrode includes a material that is different from that of the first output electrode.

In an embodiment, the connection electrode may include a material whose resistance is lower than that of the first output electrode.

In an embodiment, the display panel may further include a signal line that is disposed in the second region and overlaps the first groove and the second groove. The signal line may be disposed on the same layer as the connection electrode.

In an embodiment, a plurality of inorganic layers may be disposed to expose a portion of a top surface of the base layer, and the organic layer may be disposed to be in contact with the portion of the top surface of the organic layer.

In an embodiment, the display panel may further include a pixel definition layer disposed on the organic layer to define an opening. The organic light emitting diode may be disposed in the opening. The pixel definition layer may overlap the first region and the second region and may include an organic material.

In an embodiment, the pixel definition layer may include a recessed portion on an inner surface the opening.

In an embodiment, the display panel may further include a signal line that is disposed in the second region and overlaps the first groove and the second groove. The signal line may be disposed on the same layer as the second output electrode.

In an embodiment, the signal line may include a plurality of patterns that are disposed in the second region and are spaced apart from each other in a direction crossing the bending axis.

In an embodiment, the passivation layer may be in contact with the oxide semiconductor pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A to 4C are sectional views, each illustrating a bending region of a display panel according to an embodiment of the inventive concept.

FIGS. 10A to 10D are sectional views illustrating a method of fabricating a display panel according to an embodiment of the inventive concept.

It should be noted that these figures are intended to illustrate the general characteristics of methods, structure, and/or materials utilized in certain example embodiments and to supplement the written description provided below. These drawings are not, however, to scale and may not precisely reflect the precise structural or performance characteristics of any given embodiments, and should not be interpreted as defining or limiting the range of values or properties encompassed by example embodiments. For example, the relative thicknesses and positioning of molecules, layers, regions, and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1A:
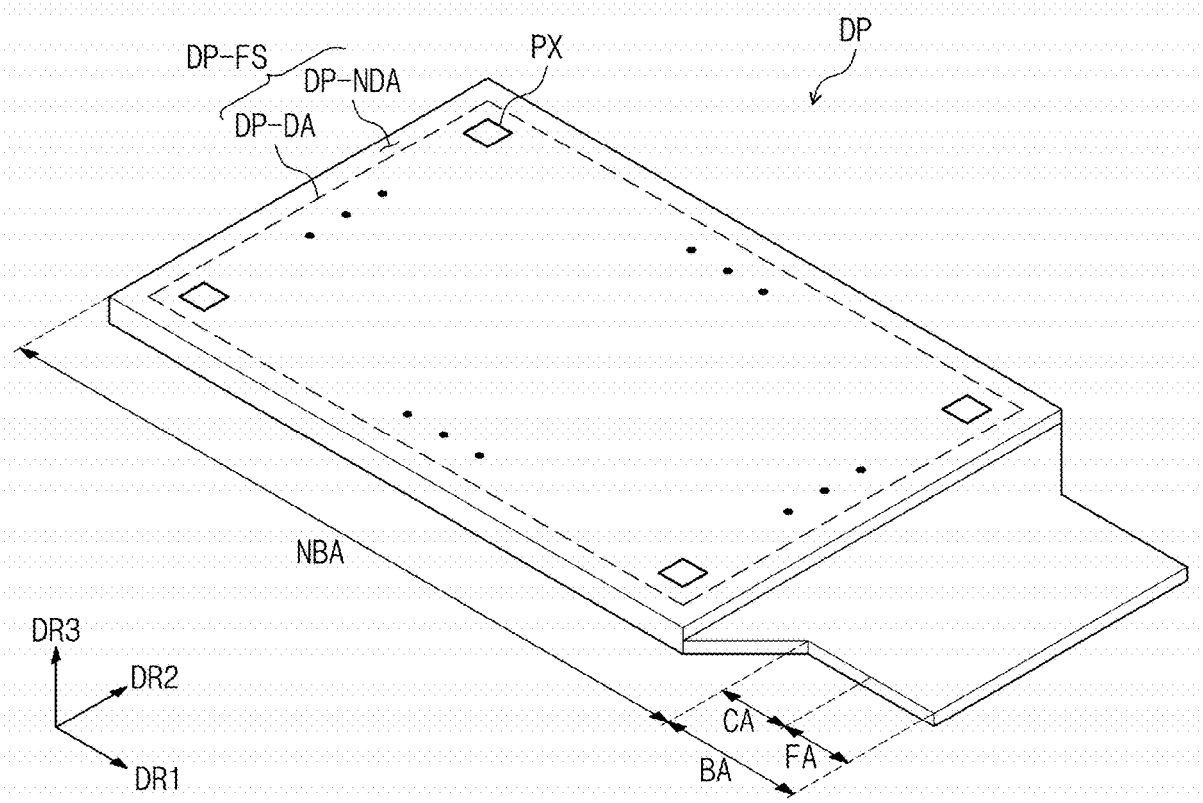
FIGS. 1A and 1B are perspective views illustrating a display panel according to an embodiment of the inventive concept.
Figure 1B:
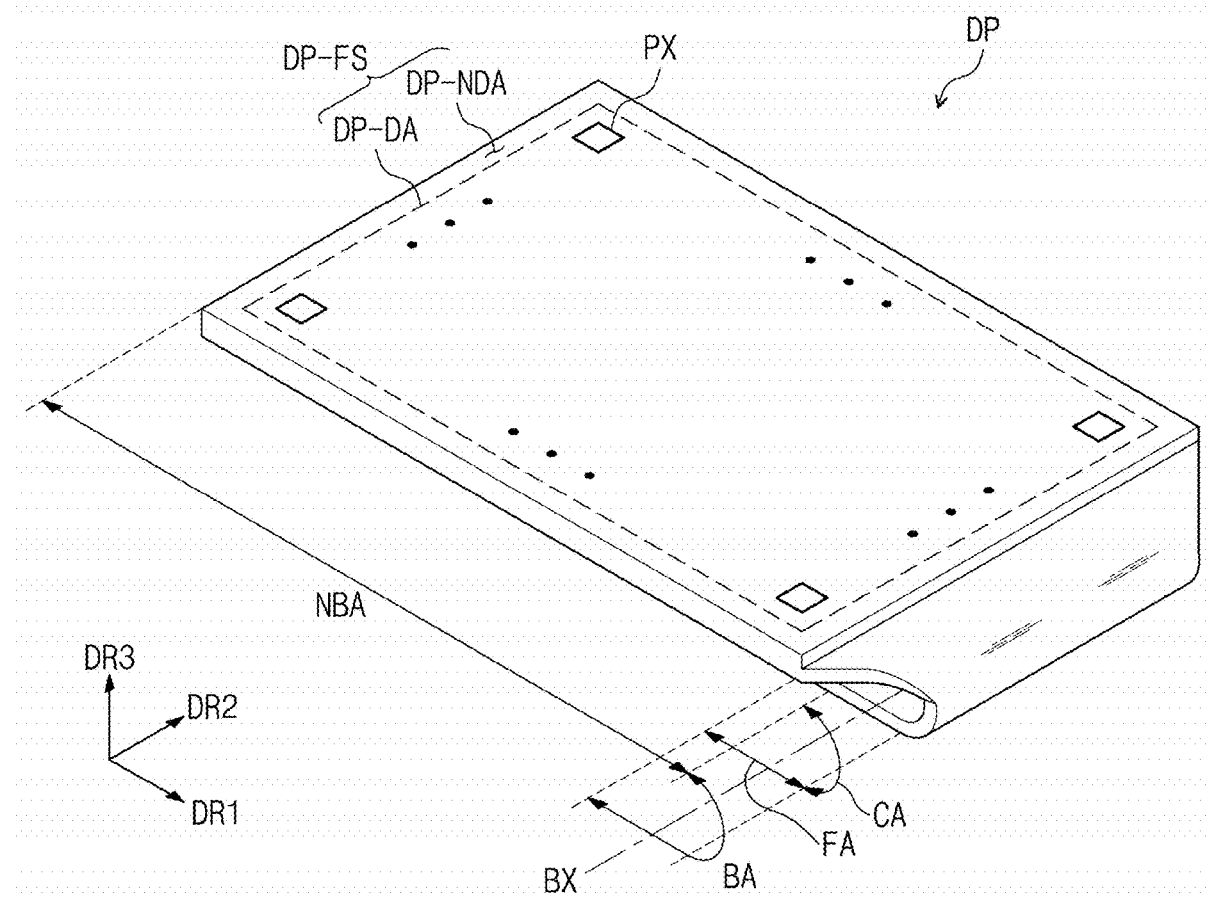
Figure 2:
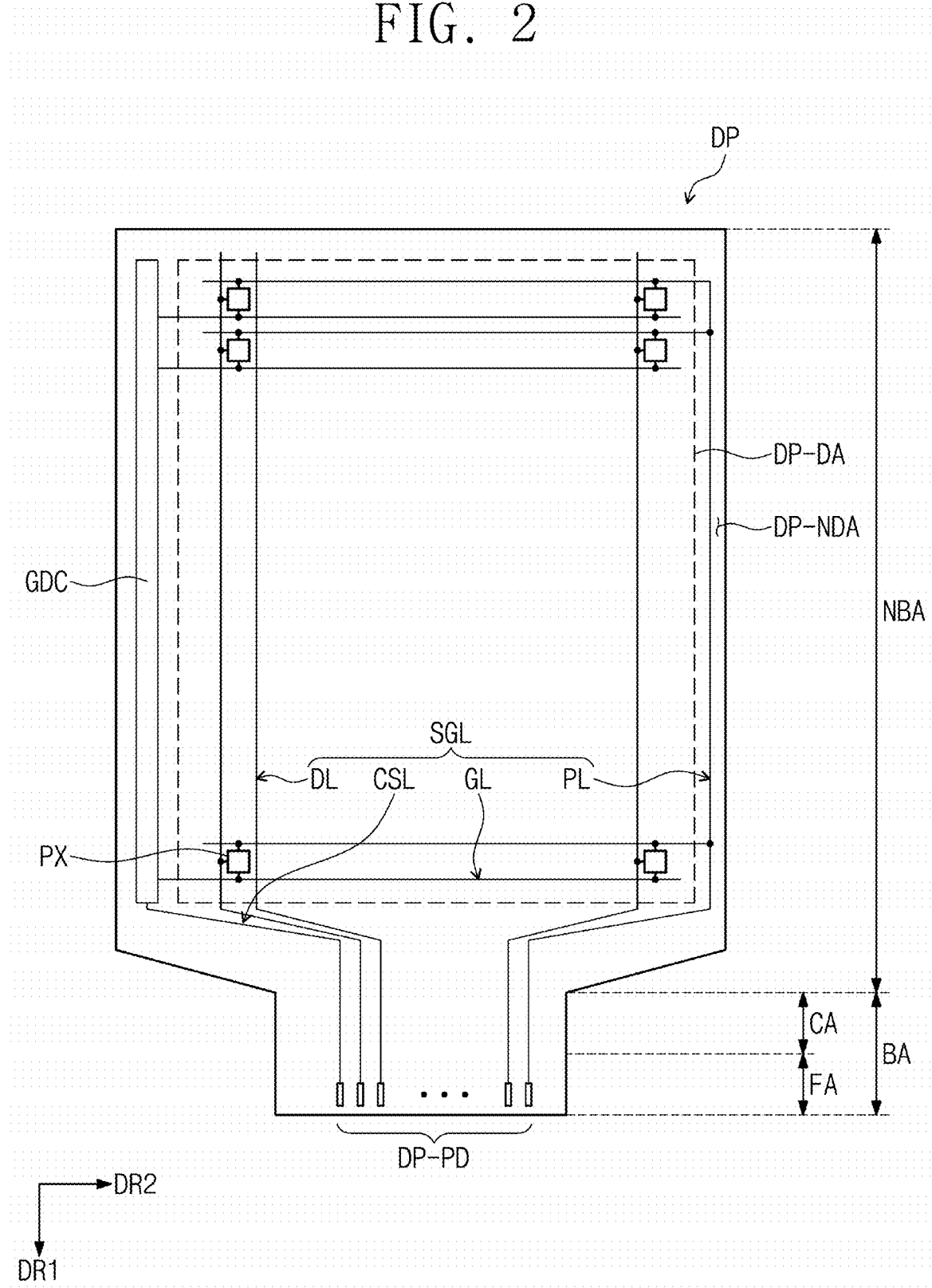
FIG. 2 is a plan view of a display panel shown in FIG. 1A.

FIGS. 1A and 1B are perspective views illustrating a display panel according to an embodiment of the inventive concept. FIG. 2 is a plan view of a display panel shown in FIG. 1A. FIG. 1A illustrates a display panel DP in an unfolded state, and FIG. 1B illustrates the display panel DP, at least a portion of which is in a bent state. Hereinafter, an embodiment of the inventive concept will be described with reference to FIGS. 1A to 2.

Referring to FIGS. 1A and 1B, the display panel DP may be provided to have a front surface DP-FS that is oriented parallel to a first direction DR1 and a second direction DR2. The front surface DP-FS may include a display region DP-DA and a peripheral region DP-NDA. The display region DP-DA may be a region of the front surface DP-FS that is used to display an image. A thickness of the display panel DP may be measured in a third direction DR3 perpendicular to the first and second directions DR1 and DR2.

The peripheral region DP-NDA may be adjacent to the display region DP-DA. In an embodiment, the peripheral region DP-NDA may be provided along a border of the display region DP-DA to enclose the display region DP-DA. In an embodiment, the peripheral region DP-NDA may include a portion that is disposed adjacent to a bending region, whose width is smaller than that of the display region DP-DA when measured in the second direction DR2. Thus, the portion of the peripheral region DP-NDA having a reduced width may reduce a bending area of the display panel DP.

The display panel DP may include at least a portion that is bent. The display panel DP may be classified into a first region NBA (hereinafter, a non-bending region) and a second region BA (hereinafter, a bending region). The bending region BA may be defined at a relatively narrow region of the display panel DP, when measured in the second direction DR2.

When the bending region BA is in a bent state, the bending region BA may include a curvature region CA that is bent with a specific curvature and a facing region FA that is provided to face the non-bending region NBA. The non-bending region NBA, the curvature region CA, and the facing region FA may be arranged in the first direction DR1. The bending region BA may be bent around a bending axis BX extending in the second direction DR2. For example, the curvature region CA of the bending region BA may be bent around the bending axis BX, and the facing region FA of the bending region BA may be placed to face a portion of the non-bending region NBA in the third direction DR3.

Referring to FIG. 2, the display panel DP may include a plurality of pixels PX, a plurality of signal lines SGL, and a driving circuit GDC. The plurality of pixels PX and the plurality of signal lines SGL may be provided on the front surface DP-FS.

The pixels PX may be provided in the display region DP-DA. In an embodiment, the display region DP-DA is illustrated to have a tetragonal or rectangular shape, but the inventive concept is not limited thereto. Each of the pixels PX may be configured to display light having a specific color. The pixels PX may be classified into a plurality of groups, according to colors of lights to be emitted therethrough. For example, the pixels PX may include red pixels, green pixels, and blue pixels. In certain embodiments, the pixels PX may further include white pixels. Even when pixels are included in different groups, the pixel driving circuits of the pixels may be configured to have the same structure.

The driving circuit GDC may be provided in the peripheral region DP-NDA. The peripheral region DP-NDA may be adjacent to the display region DP-DA. In an embodiment, the peripheral region DP-NDA is illustrated to enclose the display region DP-DA, but the inventive concept is not limited thereto.

The driving circuit GDC may include a gate driving circuit. The gate driving circuit may be configured to generate a plurality of gate signals and sequentially output the gate signals to a plurality of gate lines GL to be described below. In certain embodiments, the gate driving circuit may be configured to output other control signals that are different from the gate signals to the pixels PX.

The gate driving circuit may include a plurality of thin-film transistors that are formed by the same process as that for the pixel driving circuit of the pixels PX (e.g., by a low temperature polycrystalline silicon (LTPS) process or a low temperature polycrystalline oxide (LTPO) process).

The signal lines SGL may include gate lines GL, data lines DL, a power line PL, and a control signal line CSL. Each of the gate lines GL and each of the data lines DL may be connected to corresponding ones of the pixels PX. The power line PL may be connected to the pixels PX. The control signal line CSL may be configured to deliver the control signals to a scan driving circuit. The driving circuit GDC may include the scan driving circuit.

The signal lines SGL may be connected to signal pads DP-PD, respectively. Some of the signal lines SGL (e.g., the control signal line CSL, the data line DL, and the power line PL) may be extended from the non-bending region NBA to the bending region BA and may be connected to the respective ones of the signal pads DP-PD. The signal pads DP-PD may be electrically connected to a circuit substrate that may be externally provided. The signal pads DP-PD may be provided in the facing region FA of the bending region BA.

In an embodiment, the display panel DP may further include a driving chip that is connected to the data lines DL. Here, the driving chip may be directly mounted on the display panel DP, and ones of the signal pads DP-PD that are connected to the data lines DL may be connected to the driving chip. The structure of the display panel DP may be variously changed, and the inventive concept is not limited to a specific structure of the display panel DP.

Figure 3A:
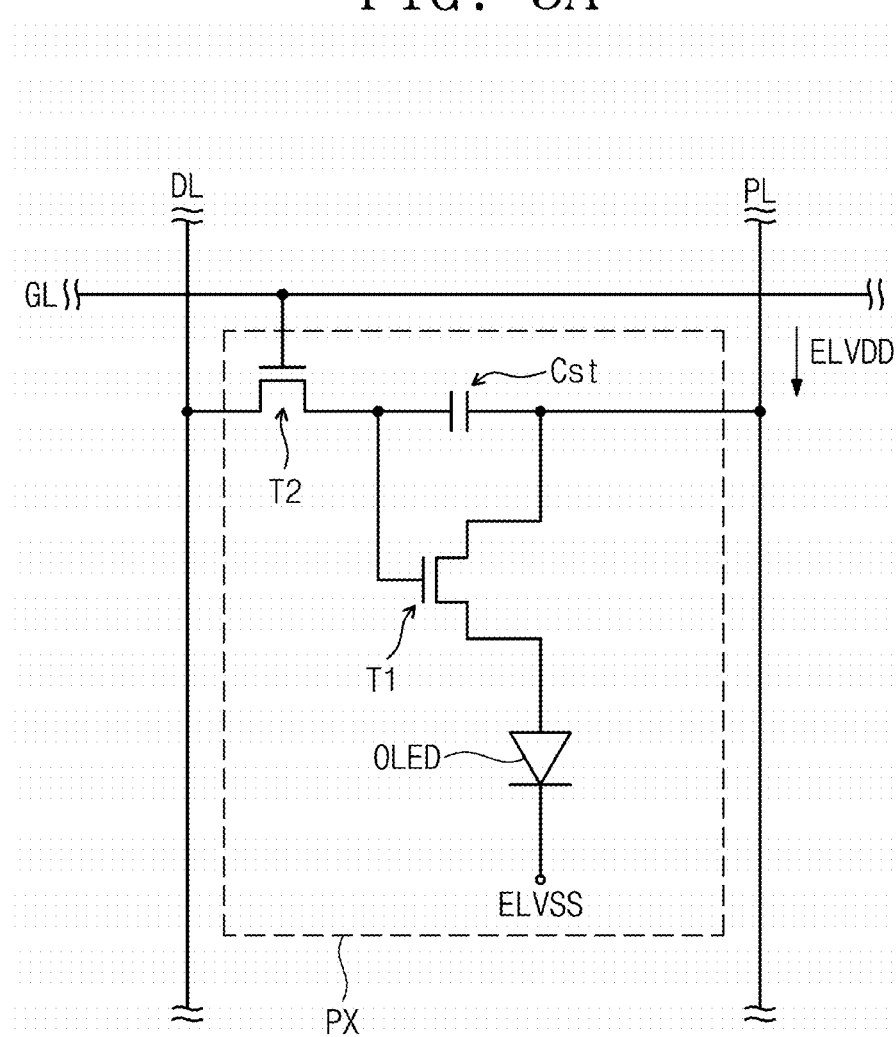
FIG. 3A is an equivalent circuit diagram of a pixel according to an embodiment of the inventive concept.
Figure 3B:
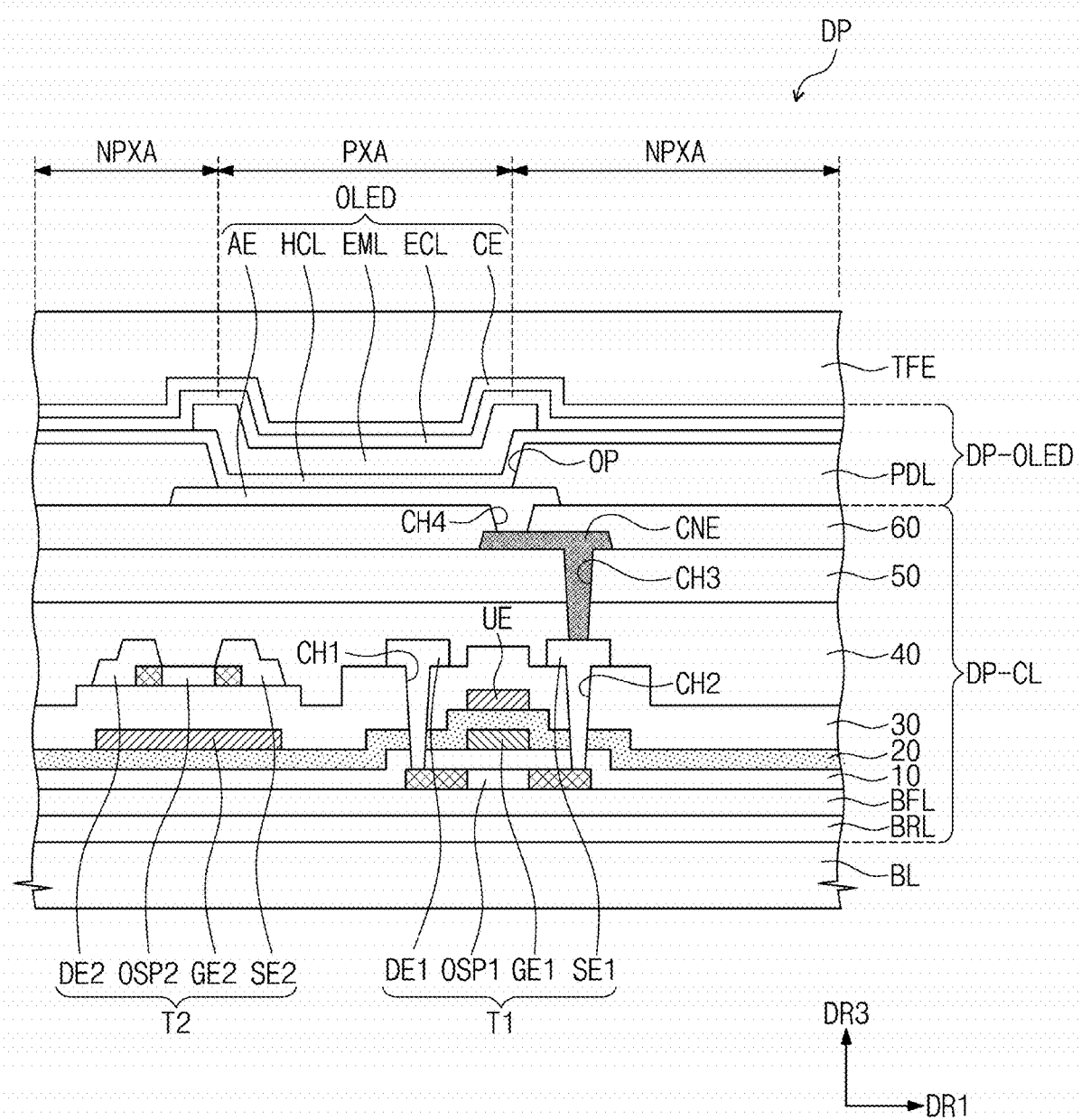
FIGS. 3B and 3C are sectional views, each illustrating a portion of the pixel of FIG. 3A.
Figure 3C:
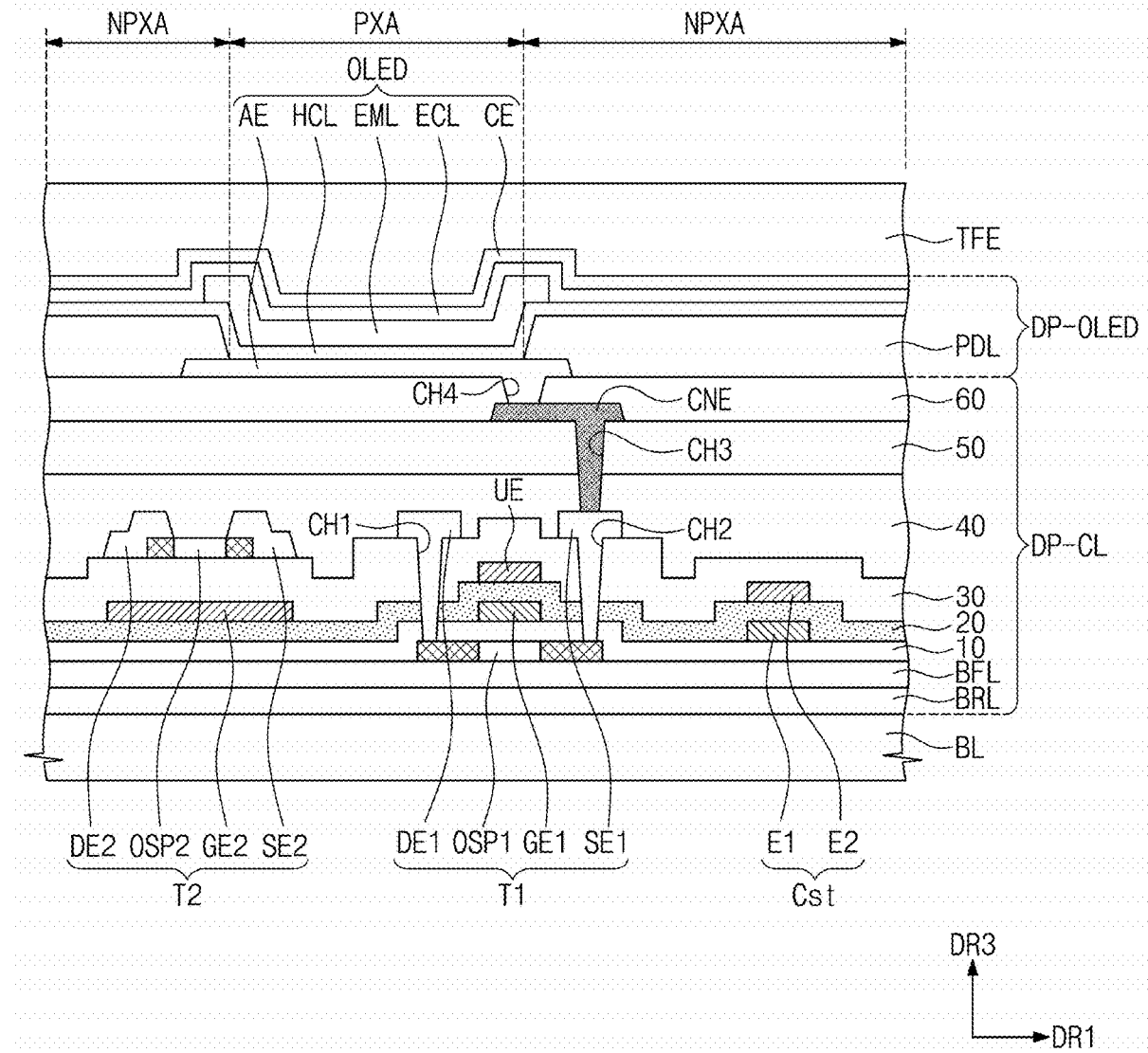

FIG. 3A is an equivalent circuit diagram of a pixel according to an embodiment of the inventive concept. FIGS. 3B and 3C are sectional views, each illustrating a portion of the pixel of FIG. 3A. For convenience in illustration, one of the pixels PX is exemplarily illustrated in FIG. 3A. Hereinafter, the pixel PX will be described in more detail with reference to FIGS. 3A to 3C. For concise description, an element previously described with reference to FIGS. 1A to 2 may be identified by the same reference number without repeating an overlapping description thereof.

As shown in FIG. 3A, the pixel PX may be connected to a corresponding one of the data lines DL, a corresponding one of the gate lines GL, and the power line PL. For example, the pixel PX may include an organic light emitting diode or a quantum-dot light-emitting diode. A luminescent layer of the organic light emitting diode may include an organic luminescent material. A luminescent layer of the quantum-dot light-emitting diode may include quantum dots and quantum rods. For the sake of simplicity, the following description will refer to an example in which the pixel PX includes an organic light emitting diode.

The pixel PX may include a first thin-film transistor T1, a second thin-film transistor T2, a capacitor Cst, and an organic light emitting diode OLED. The first thin-film transistor T1, the second thin-film transistor T2, and the capacitor Cst may constitute a pixel driving circuit for driving the organic light emitting diode OLED. In certain embodiments, the pixel driving circuit may further include at least one more thin-film transistor or at least one more capacitor, in addition to the first thin-film transistor T1, the second thin-film transistor T2, and the capacitor Cst, but the inventive concept is not limited thereto.

The first thin-film transistor T1 may be connected to the organic light emitting diode OLED. The first thin-film transistor T1 may be used to control a driving current flowing through the organic light emitting diode OLED, depending on an amount of electric charges stored in the capacitor Cst. The second thin-film transistor T2 may be connected to the gate line GL and the data line DL. The second thin-film transistor T2 may be configured to output a data signal from the data line DL to the capacitor Cst, in response to a gate signal applied to the gate line GL. An amount of electric charges to be stored in the capacitor Cst may be determined by a difference between a voltage corresponding to the data signal that is output from the second thin-film transistor T2 and a first power voltage ELVDD that is transmitted through the power line PL.

A turn-on time of the first thin-film transistor T1 may be determined depending on the amount of charges stored in the capacitor Cst. The organic light emitting diode OLED may be configured to emit light, when the first thin-film transistor T1 is in a turn-on period. The color (i.e., wavelength) of light emitted from the organic light emitting diode OLED may be determined by a material of a light-emitting pattern. For example, the organic light emitting diode OLED may be configured to emit light of red, green, blue, or white color, but the inventive concept is not limited thereto.

A sectional structure of the pixel PX will be described with reference to FIGS. 3B and 3C. Here, FIG. 3B illustrates a region of the pixel PX, in which the first thin-film transistor T1, the second thin-film transistor T2, and the organic light emitting diode OLED are provided, and FIG. 3C illustrates another region of the pixel PX, in which the first thin-film transistor T1, the second thin-film transistor T2, the organic light emitting diode OLED, and the capacitor Cst are provided. That is, FIGS. 3B and 3C illustrate two different regions of the same pixel PX, respectively.

As shown in FIGS. 3B and 3C, the display panel DP may include a base layer BL, a circuit device layer DP-CL, a display device layer DP-OLED, and an encapsulation layer TFE. The base layer BL, the circuit device layer DP-CL, the display device layer DP-OLED, and the encapsulation layer TFE may be stacked in the third direction DR3.

The base layer BL may be a layer, film, or plate, on which the first thin-film transistor T1, the second thin-film transistor T2, and the capacitor Cst are formed. The base layer BL may include a plastic substrate, a glass substrate, a metal substrate, or a composite substrate including organic and/or inorganic materials. The plastic substrate may include a synthetic resin layer. The synthetic resin layer may include a thermosetting resin. The synthetic resin layer may be a polyimide-based resin layer, but the inventive concept is not limited to a specific material. For example, the synthetic resin layer may include at least one of acryl resins, methacryl resins, polyisoprene resins, vinyl resins, epoxy resins, urethane resins, cellulose resins, siloxane resins, polyamide resins, and perylene resins.

The base layer BL may define a planar shape of the display panel DP. For example, a shape of the display panel DP shown in FIG. 1A may correspond to a planar shape of the base layer BL. Accordingly, the base layer BL may include the non-bending region NBA, the bending region BA including the curvature region CA and the facing region FA, and a portion of the base layer BL corresponding to the bending region BA may be bent around the bending axis BX.

The circuit device layer DP-CL may be provided on the base layer BL. The circuit device layer DP-CL may include a pixel driving circuit and a plurality of insulating layers. For example, the circuit device layer DP-CL may be configured to include a barrier layer BRL, a buffer layer BFL, and first to sixth insulating layers 10, 20, 30, 40, 50, and 60, in addition to the first thin-film transistor T1, the second thin-film transistor T2, and the capacitor Cst.

The barrier layer BRL may be provided to cover a top surface of the base layer BL. The barrier layer BRL may be configured to prevent a contamination material from permeating into the circuit device layer DP-CL and the display device layer DP-OLED through the base layer BL. The barrier layer BRL may include a silicon oxide layer and a silicon nitride layer. The silicon oxide layer and the silicon nitride layer may be alternatingly stacked on the base layer BL.

The buffer layer BFL may be provided on the barrier layer BRL. The buffer layer BFL may be configured to allow conductive patterns or semiconductor patterns to be more tightly bonded to the base layer BL. Therefore, the conductive patterns and the semiconductor patterns may be stably formed on the buffer layer BFL provided in the display panel DP, compared to a structure of the pixel in which the conductive patterns and semiconductor patterns are directly formed on the top surface of the base layer BL without the buffer layer BFL. The buffer layer BFL may be formed of or include at least one of inorganic and organic materials. The buffer layer BFL may include a silicon oxide layer and a silicon nitride layer. The silicon oxide layer and the silicon nitride layer may be stacked alternatingly. In certain embodiments, at least one of the buffer layer BFL and the barrier layer BRL may be omitted.

A first semiconductor pattern OSP1 may be provided on the buffer layer BFL. The first semiconductor pattern OSP1 may be formed of or include a crystalline semiconductor material. For example, the first semiconductor pattern OSP1 may be formed of or include a polycrystalline semiconductor material (e.g., poly silicon).

The first semiconductor pattern OSP1 may include an input region and an output region that are doped with impurities, and a channel region that is provided between the input and output regions. In FIGS. 3B and 3C, the input and output regions are illustrated with a hatched pattern, for convenience in illustration.

The input region may be coupled to a first input electrode DE1, and the output region may be coupled to a first output electrode SE1. The channel region of the first semiconductor pattern OSP1 may be provided between the input region and the output region and may overlap a first control electrode GE1, when viewed in a plan view. According to the type of the impurities, the first semiconductor pattern OSP1 may be of p or n-type conductivity. According to the type of the first semiconductor pattern OSP1, electrons or holes may flow as majority carriers in the channel region.

The channel region of the first thin-film transistor T1 may be formed of or include a polycrystalline semiconductor material. Thus, the first thin-film transistor T1 may be used as a driving device with high mobility and high reliability.

The first insulating layer 10 may be provided on the first semiconductor pattern OSP1. The first insulating layer 10 may be formed of or include at least one of inorganic and organic materials. For example, the first insulating layer 10 may be formed of or include silicon nitride and/or silicon oxide.

The first insulating layer 10 may be provided on the buffer layer BFL to cover at least a portion of the first semiconductor pattern OSP1. However, the inventive concept is not limited thereto, and in certain embodiments, the first insulating layer 10 may be provided in an insulating pattern that overlaps at least the channel region of the first semiconductor pattern OSP1. The shape of the first insulating layer 10 may be variously changed, and the inventive concept is not limited to a specific shape of the first insulating layer 10.

The first control electrode GE1 and a first capacitor electrode E1 of the capacitor Cst may be provided on the first insulating layer 10. In an embodiment, the first control electrode GE1 may be provided on the same layer as the first capacitor electrode E1.

The first control electrode GE1 may overlap at least the channel region of the first semiconductor pattern OSP1. The first control electrode GE1 may be spaced apart from the first semiconductor pattern OSP1 with the first insulating layer 10 interposed therebetween. In an embodiment, the first insulating layer 10 may serve as a gate insulating layer of the first thin-film transistor T1.

The first capacitor electrode E1 may be used as one of two electrodes of the capacitor Cst. In an embodiment, the first capacitor electrode E1 and the first control electrode GE1 may correspond to two parts of a single conductive pattern. In certain embodiments, the first control electrode GE1 and the first capacitor electrode E1 may correspond to two separate patterns that are electrically connected to each other by an additional bridge electrode (not shown), or that are electrically disconnected from each other and are applied with different voltages, respectively.

The second insulating layer 20 may be provided on the first control electrode GE1 and the first capacitor electrode E1. The second insulating layer 20 may be provided on the first insulating layer 10 to cover the first control electrode GE1 and the first capacitor electrode E1.

The second insulating layer 20 may be formed of or include at least one of inorganic and organic materials. The second insulating layer 20 may include a material that is different from that of the first insulating layer 10. For example, the second insulating layer 20 may include a metal oxide material (e.g., aluminum oxide), and the first insulating layer 10 may include silicon nitride and/or silicon oxide. However, the inventive concept is not limited thereto, and in certain embodiments, the second insulating layer 20 may be formed of or include the same material as that of the first insulating layer 10. The second insulating layer 20 may be used to protect the first insulating layer 10 in a subsequent process (e.g., for forming a second control electrode GE2) and thus to prevent the first semiconductor pattern OSP1 that is provided below the first insulating layer 10 from being damaged.

The second control electrode GE2 of the second thin-film transistor T2, an upper electrode UE, and a second capacitor electrode E2 of the capacitor Cst may be provided on the second insulating layer 20. The second control electrode GE2 may not overlap the first control electrode GE1, when viewed in a plan view. In an embodiment, the second control electrode GE2 may be provided on a layer that is different from a layer provided under the first control electrode GE1.

The upper electrode UE may overlap the first control electrode GE1, when viewed in a plan view. In a case where the upper electrode UE and the first control electrode GE1 are applied with different voltages, the upper electrode UE and the first control electrode GE1 may serve as electrodes of a capacitor. In certain embodiments, in a case where the upper electrode UE and the first control electrode GE1 are applied with the same voltage, the upper electrode UE, along with the first control electrode GE1, may be used as a gate electrode for controlling a switching (i.e., on/off) operation of the first thin-film transistor T1 or an electric potential of the channel region of the first semiconductor pattern OSP1.

The second capacitor electrode E2 may overlap the first capacitor electrode E1, when viewed in a plan view. The second capacitor electrode E2 may be spaced apart from the first capacitor electrode E1 with the second insulating layer 20 interposed therebetween, thereby forming the capacitor Cst.

In an embodiment, the upper electrode UE, the second capacitor electrode E2, and the second control electrode GE2 may be provided on the same layer. For example, the upper electrode UE, the second capacitor electrode E2, and the second control electrode GE2 may be simultaneously formed by a single patterning process using the same mask. Accordingly, the upper electrode UE, the second capacitor electrode E2, and the second control electrode GE2 may be formed of or include the same material and may have substantially the same stacking structure. In certain embodiments, the upper electrode UE may be omitted.

The third insulating layer 30 may be provided on the second insulating layer 20. The third insulating layer 30 may be provided to cover the top surface of the second insulating layer 20, the top surface of the upper electrode UE, the top surface of the second control electrode GE2, and the top surface of the second capacitor electrode E2. The third insulating layer 30 may serve as a gate insulating layer of the second thin-film transistor T2.

The third insulating layer 30 may be an inorganic layer and/or an organic layer and may have a single- or multi-layered structure. For example, the third insulating layer 30 may be an inorganic layer that is formed of or includes at least one of aluminum oxide, titanium oxide, silicon oxide, silicon oxynitride, zirconium oxide, and hafnium oxide. For example, the third insulating layer 30 may be a single silicon oxide layer.

A second semiconductor pattern OSP2 of the second thin-film transistor T2 may be provided on the third insulating layer 30. The second semiconductor pattern OSP2 may be formed of or include at least one of oxide semiconductors. For example, the oxide semiconductors may include metal oxides, whose metallic element is at least one of zinc (Zn), indium (In), gallium (Ga), tin (Sn), and titanium (Ti), or may include a mixture of zinc (Zn), indium (In), gallium (Ga), tin (Sn), and titanium (Ti), and an oxide thereof. In certain embodiments, the second semiconductor pattern OSP2 may include a crystallized oxide semiconductor. The crystallized oxide semiconductor may be provided to have a vertical directionality.

The second semiconductor pattern OSP2 may include an input region and an output region that are doped with impurities, and a channel region that is provided between the input region and the output region. In FIGS. 3B and 3C, the input and output regions of the second semiconductor pattern OSP2 are illustrated with a hatched pattern, for convenience in illustration. The input region may be coupled to a second input electrode DE2, and the output region may be coupled to a second output electrode SE2. The channel region of the second semiconductor pattern OSP2 may be provided between the input region and the output region and may overlap the second control electrode GE2, when viewed in a plan view. According to the type of the impurities, the second semiconductor pattern OSP2 may be of p or n-type conductivity. According to the type of the second semiconductor pattern OSP2, electrons or holes may flow as majority carriers in the channel region.

A reduced metal material may be used as the impurities in the second semiconductor pattern OSP2. For example, the input region and the output region may contain a metallic material that is reduced from a metal oxide material constituting the channel region, thereby reducing a leakage current of the second thin-film transistor T2, and thus, the second thin-film transistor T2 may be used as a switching device having an improved on-off property.

The first input electrode DE1 and the first output electrode SE1 of the first thin-film transistor T1 and the second input electrode DE2 and the second output electrode SE2 of the second thin-film transistor T2 may be provided on the third insulating layer 30. In an embodiment, the first input electrode DE1, the first output electrode SE1, the second input electrode DE2, and the second output electrode SE2 may be simultaneously formed by a single patterning process using the same mask. Accordingly, the first input electrode DE1, the first output electrode SE1, the second input electrode DE2, and the second output electrode SE2 may be formed of or include the same material and may have the same stacking structure. For example, the first input electrode DE1, the first output electrode SE1, the second input electrode DE2, and the second output electrode SE2 may be formed of or include molybdenum.

A first contact hole CH1 and a second contact hole CH2 may be formed to expose a portion of the input region and the output region of the first semiconductor pattern OSP1, respectively, and the first input electrode DE1 and the first output electrode SE1 may be coupled to the first semiconductor pattern OSP1 through the first and second contact holes CH1 and CH2, respectively. The first contact hole CH1 and the second contact hole CH2 may be formed to penetrate through the first to third insulating layers 10, 20, and 30.

The second input electrode DE2 and the second output electrode SE2 may be directly coupled to the second semiconductor pattern OSP2. The second input electrode DE2 and the second output electrode SE2 may be coupled to two opposite ends of the second semiconductor pattern OSP2, respectively. At least a portion of the second input electrode DE2 may be directly provided in the input region of the second semiconductor pattern OSP2, and at least a portion of the second output electrode SE2 may be directly provided in the output region of the second semiconductor pattern OSP2. In the second thin-film transistor T2, each of the second input electrode DE2 and the second output electrode SE2 may be coupled to the second semiconductor pattern OSP2, without any portion provided in a contact hole.

The fourth insulating layer 40 may be provided on the third insulating layer 30 to cover the first input electrode DE1, the first output electrode SE1, the second input electrode DE2, and the second output electrode SE2. The fourth insulating layer 40 may be an organic or inorganic layer and may have a single- or multi-layered structure.

In an embodiment, the fourth insulating layer 40 may be an inorganic layer that is formed of or includes at least one of aluminum oxide, titanium oxide, silicon oxide, silicon oxynitride, zirconium oxide, and hafnium oxide. For example, the fourth insulating layer 40 may be a silicon oxide layer. The fourth insulating layer 40 may be referred to as "a passivation layer".

In an embodiment, the fourth insulating layer 40 may be formed through a thermal treatment process. For example, the thermal treatment process may be performed at a high temperate of 300° C. or higher, and resultantly, the fourth insulating layer 40 may be cured with defects. A detailed description thereof will be omitted.

The fifth insulating layer 50 may be provided on the fourth insulating layer 40. The fifth insulating layer 50 may be an organic layer. For example, the fifth insulating layer 50 may be formed of or include a polymer resin such as polyimide.

A connection electrode CNE may be provided on the fifth insulating layer 50. The connection electrode CNE may be connected to the first output electrode SE1 of the first thin-film transistor T1 through a third contact hole CH3 that is formed to penetrate through the fourth insulating layer 40 and the fifth insulating layer 50.

The connection electrode CNE may be formed of or include a material that is different from the first input electrode DE1, the first output electrode SE1, the second input electrode DE2, and the second output electrode SE2. For example, the connection electrode CNE may be formed of or include a material whose electric resistance is lower than those of the first input electrode DE1, the first output electrode SE1, the second input electrode DE2, and the second output electrode SE2. In this case, a contact resistance between the organic light emitting diode OLED and the first thin-film transistor T1 may be reduced, thereby improving electric characteristics of the display device.

However, the inventive concept is not limited to the above example, and in certain embodiments, the connection electrode CNE may be formed of or include the same material as the first input electrode DE1, the first output electrode SE1, the second input electrode DE2, and the second output electrode SE2. In certain embodiments, the connection electrode CNE may be omitted, and the organic light emitting diode OLED and the first thin-film transistor T1 may be directly coupled to each other. The structure of the display panel DP may be variously changed, and the inventive concept is not limited to a specific structure of the display panel DP.

The sixth insulating layer 60 may be provided on the fifth insulating layer 50 to cover the connection electrode CNE. The sixth insulating layer 60 may be an organic layer and may have a single- or multi-layered structure.

In an embodiment, the fifth insulating layer 50 and the sixth insulating layer 60 may be a polyimide resin layer having a single-layered structure. However, the inventive concept is not limited thereto, and in certain embodiments, the fifth insulating layer 50 and the sixth insulating layer 60 may include at least one of acryl resins, methacryl resins, polyisoprene resins, vinyl resins, epoxy resins, urethane resins, cellulose resins, siloxane resins, polyamide resins, and perylene resins.

The organic light emitting diode OLED may be provided on the sixth insulating layer 60. A first electrode AE of the organic light emitting diode OLED may be provided on the sixth insulating layer 60. The first electrode AE may be connected to the connection electrode CNE through a fourth contact hole CH4 that is formed to penetrate through the sixth insulating layer 60.

A pixel definition layer PDL may be provided on the sixth insulating layer 60. The pixel definition layer PDL may have an opening OP that is formed to expose at least a portion of the first electrode AE. The opening OP of the pixel definition layer PDL may define a light-emitting region PXA of each pixel. For example, a plurality of the pixels PX may be regularly arranged on a flat surface of the display panel DP (e.g., see FIG. 1A). Regions in which the pixels PX are provided may be defined as 'pixel regions', and each of the pixel regions may include the light-emitting region PXA and a non-light-emitting region NPXA adjacent to the light-emitting region PXA. The non-light-emitting region NPXA may enclose the light-emitting region PXA.

A hole control layer HCL may be commonly provided in the light-emitting region PXA and the non-light-emitting region NPXA. A common layer such as the hole control layer HCL refers to a layer that is commonly provided in a plurality of the pixels PX. The hole control layer HCL may include a hole transport layer and a hole injection layer.

A light-emitting pattern EML may be provided on the hole control layer HCL. The light-emitting pattern EML may be locally provided in a region corresponding to the opening OP. The light-emitting pattern EML may be divided into a plurality of separate patterns that are respectively formed in the pixels PX.

In an embodiment, the light-emitting pattern EML is illustrated to have a patterned structure, but in certain embodiments, the light-emitting pattern EML may be provided to have a continuous structure spanning a plurality of the pixels PX. Here, the light-emitting pattern EML may be configured to generate a white-color light. In addition, the light-emitting pattern EML may be provided to have a multi-layered structure.

An electron control layer ECL may be provided on the light-emitting pattern EML. The electron control layer ECL may include an electron transport layer and an electron injection layer. A second electrode CE may be provided on the electron control layer ECL. The electron control layer ECL and the second electrode CE may be commonly provided in the plurality of pixels PX.

The encapsulation layer TFE may be provided on the second electrode CE. The encapsulation layer TFE may be provided to commonly cover a plurality of the pixels PX. In an embodiment, the encapsulation layer TFE may be provided to directly cover the second electrode CE. In certain embodiments, a capping layer may be provided to cover the second electrode CE. The capping layer may be an organic layer. In an embodiment, an inorganic layer that is formed by a sputtering method may be additionally formed on the capping layer. In an embodiment, a stacking structure of the organic light emitting diode OLED may have a shape obtained by capsizing the stacking structure of the organic light emitting diode OLED that is illustrated in FIG. 3B.

The encapsulation layer TFE may include at least one of an inorganic layer and an organic layer. In an embodiment, the encapsulation layer TFE may include two inorganic layers and an organic layer therebetween. In an embodiment, the encapsulation layer TFE may include a plurality of inorganic layers and a plurality of organic layers that are alternately stacked.

The inorganic encapsulation layer may protect the organic light emitting diode OLED from moisture or oxygen, and the organic encapsulation layer may be provided to protect the organic light emitting diode OLED from foreign substances (e.g., dust particles) and to provide a flat top surface. The inorganic encapsulation layer may include a silicon nitride layer, a silicon oxynitride layer, a silicon oxide layer, a titanium oxide layer, or an aluminum oxide layer, but the inventive concept is not limited thereto. The organic encapsulation layer may include an acrylic organic layer, but the inventive concept is not limited thereto.

Figure 4A:
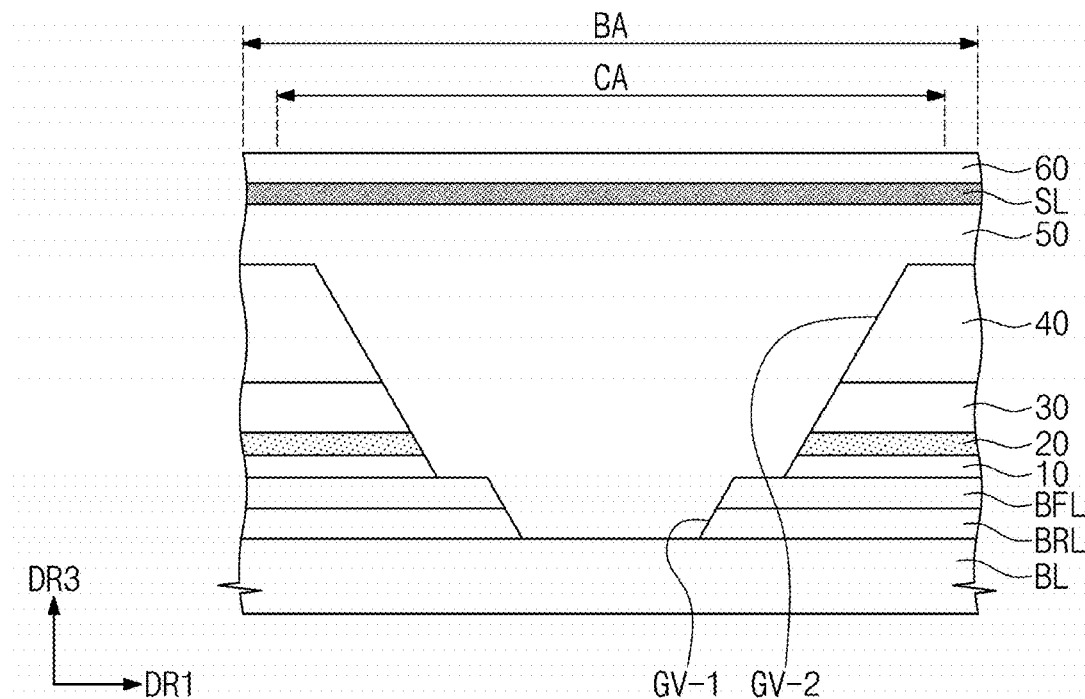
Figure 4B:
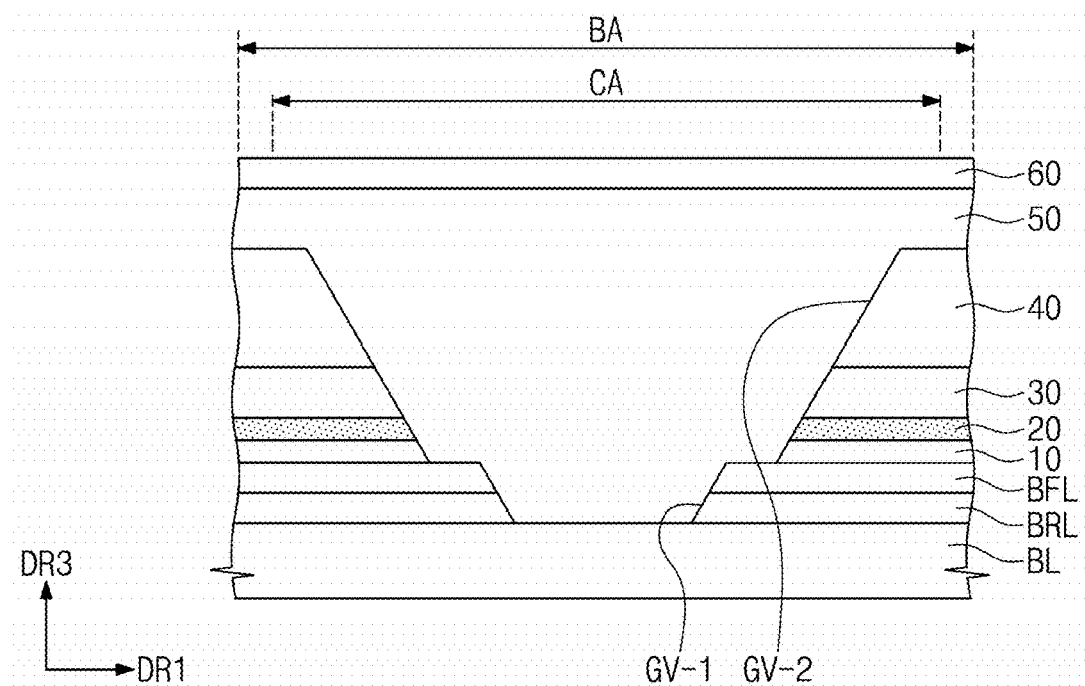

FIGS. 4A to 4C are sectional views, each illustrating a bending region of a display panel according to an embodiment of the inventive concept. Each of FIGS. 4A to 4C illustrates a section of the curvature region CA of FIG. 2 taken parallel to the first and third directions DR1 and DR3. FIGS. 4A and 4C illustrate a region on which a signal line SL or SL-PT are provided, and FIG. 4B illustrates another region on which the signal line is not provided. A signal line SL extending in the first direction DR1 is illustrated in FIG. 4A, and the signal line SL-PT that includes a plurality of patterns spaced apart from each other in the first direction DR1 are illustrated in FIG. 4C. Hereinafter, an embodiment of the inventive concept will be described in more detail with reference to FIGS. 4A to 4C. For concise description, an element previously described with reference to FIGS. 1A to 3C may be identified by the same reference number without repeating an overlapping description thereof.

As shown in FIGS. 4A to 4C, the bending region BA may have a stacking or sectional structure similar to that of the first region NBA (e.g., see FIG. 1A). The barrier layer BRL, the buffer layer BFL, and the first to sixth insulating layer 10 to 60 may be sequentially provided on the top surface of the base layer BL.

The barrier layer BRL and/or the buffer layer BFL may be provided to define a groove GV-1 (hereinafter, a first groove) that overlaps the bending region BA. The first groove GV-1 may be defined within the curvature region CA. The first groove GV-1 may extend along the curvature region CA or in a second direction (not shown). A width of the base layer BL that is exposed by the first groove GV-1 and is measured in the first direction DR1 may be less than a width of the curvature region CA in the first direction DR1.

The first to fourth insulating layers 10 to 40 may be provided to define a groove GV-2 (hereinafter, a second groove) that overlaps the bending region BA. The second groove GV-2 may be defined within the curvature region CA. The first to fourth insulating layers 10 to 40 may be provided to partially expose a top surface of the inorganic layers including the barrier layer BRL and the buffer layer BFL.

Side surfaces of the barrier layer BRL and the buffer layer BFL defining the first groove GV-1 may be inclined at an angle with respect to the top surface of the base layer BL, when viewed in a sectional view. Side surfaces of the first to fourth insulating layers 10 to 40 defining the second groove GV-2 may also be inclined at an angle with respect to the top surface of the base layer BL, when viewed in a sectional view. The inclined angles of the first groove GV-1 and the second groove GV-2 may be the same or different.

The fifth insulating layer 50 may be provided to cover the first region NBA (e.g., see FIG. 1A) and may be extended from the non-bending region NBA to cover the bending region BA. Here, in the bending region BA, the fifth insulating layer 50 may be provided to fill the first groove GV-1 and the second groove GV-2. The fifth insulating layer 50 may be in contact with the top surface of the base layer BL that is exposed by the first groove GV-1, the inclined surface of the first groove GV-1, and the inclined surface of the second groove GV-2. The fifth insulating layer 50 may be in contact with a portion of the top surface of the buffer layer BFL that is not covered with the first to fourth insulating layers 10 to 40.

In an embodiment, the number of stacked insulating layers in the curvature region CA may be reduced by providing the first groove GV-1 and the second groove GV-2 in the curvature region CA. The more the insulating layers provided in the curvature region CA, the easier defects such as delamination or buckling may occur by a bending stress. According to an embodiment of the inventive concept, since the number of the stacked insulating layers provided in the curvature region CA is reduced, the curvature region CA may be easily bent without causing defects.

In an embodiment, the first groove GV-1 and the second groove GV-2 may remove the barrier layer BRL, the buffer layer BFL, and the first to fourth insulating layers 10, 20, 30, and 40 in the curvature region CA. As described above, the barrier layer BRL, the buffer layer BFL, and the first to fourth insulating layers 10, 20, 30, and 40 may include inorganic materials. According to an embodiment of the inventive concept, by removing the inorganic layers from the curvature region CA, it may be possible to prevent or suppress the inorganic layers from being damaged by a bending stress.

In an embodiment, since the first groove GV-1 and the second groove GV-2 are filled with an organic layer (e.g., the fifth insulating layer 50), it may be possible not only to prevent a crack from propagating through the inorganic layer, but also to improve flexibility of the curvature region CA. Since the fifth insulating layer 50 that is provided in the non-bending region NBA is used to fill the first groove GV-1 and the second groove GV-2, it may be possible to simplify a fabrication process and a device structure of the display panel DP.

As shown in FIG. 4A, at least a portion of the signal line SL may be provided on the fifth insulating layer 50. The sixth insulating layer 60 may be provided to cover and protect the signal line SL. The signal line SL may correspond to at least one of the signal lines SGL connected to the signal pads DP-PD (e.g., see FIG. 2). For example, the signal line SL may be a data line or a power line. In certain embodiments, the signal line SL may be provided on a layer that is different from a layer under the signal lines SGL and the signal pads DP-PD, and may be used as a bridge line connecting the signal lines SGL and the signal pads DP-PD to each other.

Although not shown in FIG. 4A, another portion of the signal line SL (e.g., provided in the display region DP-DA) may be provided on a different layer. For example, the signal line SL may include another portion that is provided on the third insulating layer 30. These two different portions of the signal line SL may be connected to each other through a contact hole that is formed to penetrate through the fourth insulating layer 40 and the fifth insulating layer 50. The contact hole may be formed in the peripheral region DP-NDA of the non-bending region NBA.

In an embodiment, at least one of layers that are provided in the display region DP-DA may be extended to cover at least a portion of the top surface of the sixth insulating layer 60. In certain embodiments, the sixth insulating layer 60 may not be provided in the curvature region CA.

As shown in FIG. 4B, the curvature region CA may include a region, in which the signal line SL is not provided. In such a region without the signal line SL, the sixth insulating layer 60 may be in contact with the fifth insulating layer 50 or may cover the top surface of the fifth insulating layer 50.

As shown in FIG. 4C, the signal line SL-PT may be a patterned signal line including a plurality of patterns. The patterns of the patterned signal line SL-PT may be spaced apart from each other in the first direction DR1. When viewed in a plan view, the patterns of the patterned signal line SL-PT may be connected to each other by a pattern extending in the second direction DR2 (e.g., see FIG. 1A) within other region that is not shown in FIG. 4C. The patterned signal line SL-PT may allow a portion extending in a direction perpendicular to the bending axis BX (e.g., see FIG. 1B) to have a reduced area, and thereby reducing a bending stress to be exerted on the patterned signal line SL-PT.

Figure 5:
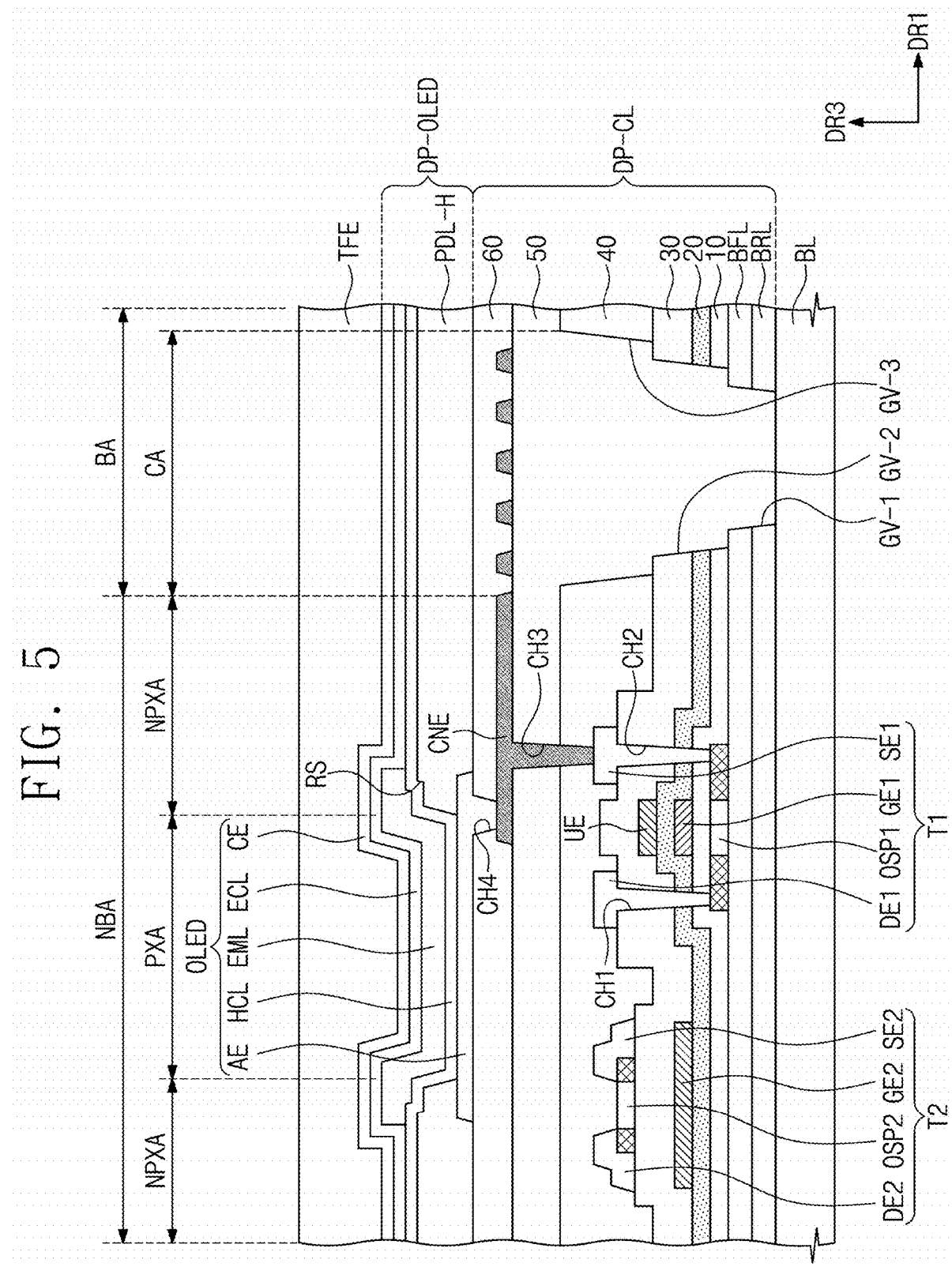
FIG. 5 is a sectional view illustrating a region of a display panel according to an embodiment of the inventive concept.

FIG. 5 is a sectional view illustrating a region of a display panel according to an embodiment of the inventive concept. FIG. 5 illustrates both a portion of the non-bending region NBA and a portion of the bending region BA. For example, in FIG. 5, the portion of the non-bending region NBA may include a light-emitting region PXA corresponding to the light-emitting region PXA shown in FIG. 3B, and the portion of the bending region BA may include a region corresponding to that of FIG. 4C. For concise description, an element previously described with reference to FIGS. 1A to 4C may be identified by the same reference number without repeating an overlapping description thereof.

As shown in FIG. 5, the display panel DP may further include a third groove GV-3 formed in the bending region BA. The second groove GV-2 may be defined in the first to third insulating layers 10, 20, and 30, and the third groove GV-3 may be defined in the fourth insulating layer 40. A portion of the fourth insulating layer 40 that overlaps the second groove GV-2 may be removed to form the third groove GV-3.

A width of the third groove GV-3 in the first direction DR1 may be larger than that of the second groove GV-2 in the first direction DR1. In addition, the width of the third groove GV-3 in the first direction DR1 may be larger than that of the first groove GV-1 in the first direction DR1. The first to third grooves GV-1, GV-2, and GV-3 may be sequentially formed in the third direction DR3 to form a staircase structure.

The fifth insulating layer 50 may be provided to fill the first to third grooves GV-1, GV-2, and GV-3 or to cover an inner surface of each of the first to third grooves GV-1, GV-2, and GV-3. In an embodiment, the display panel DP may be designed to have only an organic layer (e.g., the fifth insulating layer 50) in at least a center portion of the curvature region CA by forming the first to third grooves GV-1, GV-2, and GV-3 and filling them with the organic layer.

As shown in FIG. 5, the connection electrode CNE may be used as a signal line passing through the curvature region CA. In the non-bending region NBA, the connection electrode CNE may be configured to connect the first output electrode SE1 of the first thin-film transistor T1 to the first electrode AE of the organic light emitting diode OLED.

The connection electrode CNE may be interposed between the fifth insulating layer 50 and the sixth insulating layer 60 and may be provided to pass through the non-bending region NBA and the bending region BA. The connection electrode CNE may be used as a bridge pattern connecting a conductive pattern that is provided in the non-bending region NBA to a conductive pattern that is provided in a facing region (not shown). In an embodiment, the connection electrode CNE may include a plurality of patterns that are provided in the curvature region CA and are spaced apart from each other in the first direction DR1. In this case, the connection electrode CNE may prevent a crack or disconnection from occurring by a bending stress.

In certain embodiments, a pixel definition layer PDL-H may be provided to have a recessed portion RS that is formed around or near an opening region defining the light-emitting region PXA. For example, a mask and a spacer supporting the mask may be used in a deposition process for forming the light-emitting pattern EML, and the formation of the recessed portion RS may result from the use of the mask or the spacer. The display panel DP having the recessed portion RS may prevent the light-emitting pattern EML or the light-emitting region PXA from being damaged by the mask. The recessed portion RS may be formed by a process, in which a halftone mask is used. According to an embodiment of the inventive concept, the pixel definition layer PDL-H is used to form the light-emitting pattern EML without an additional process, thereby reducing a process cost and simplifying a fabrication process.

In an embodiment, at least one or each of the fifth insulating layer 50, the sixth insulating layer 60, and the pixel definition layer PDL-H may include an organic material. A stacking structure that overlaps the curvature region CA may be designed to include only organic materials, thereby improving flexibility of the display panel DP at the curvature region CA and achieving high reliability of the display panel DP even when a folding/unfolding operation is repeated.

Figure 6:
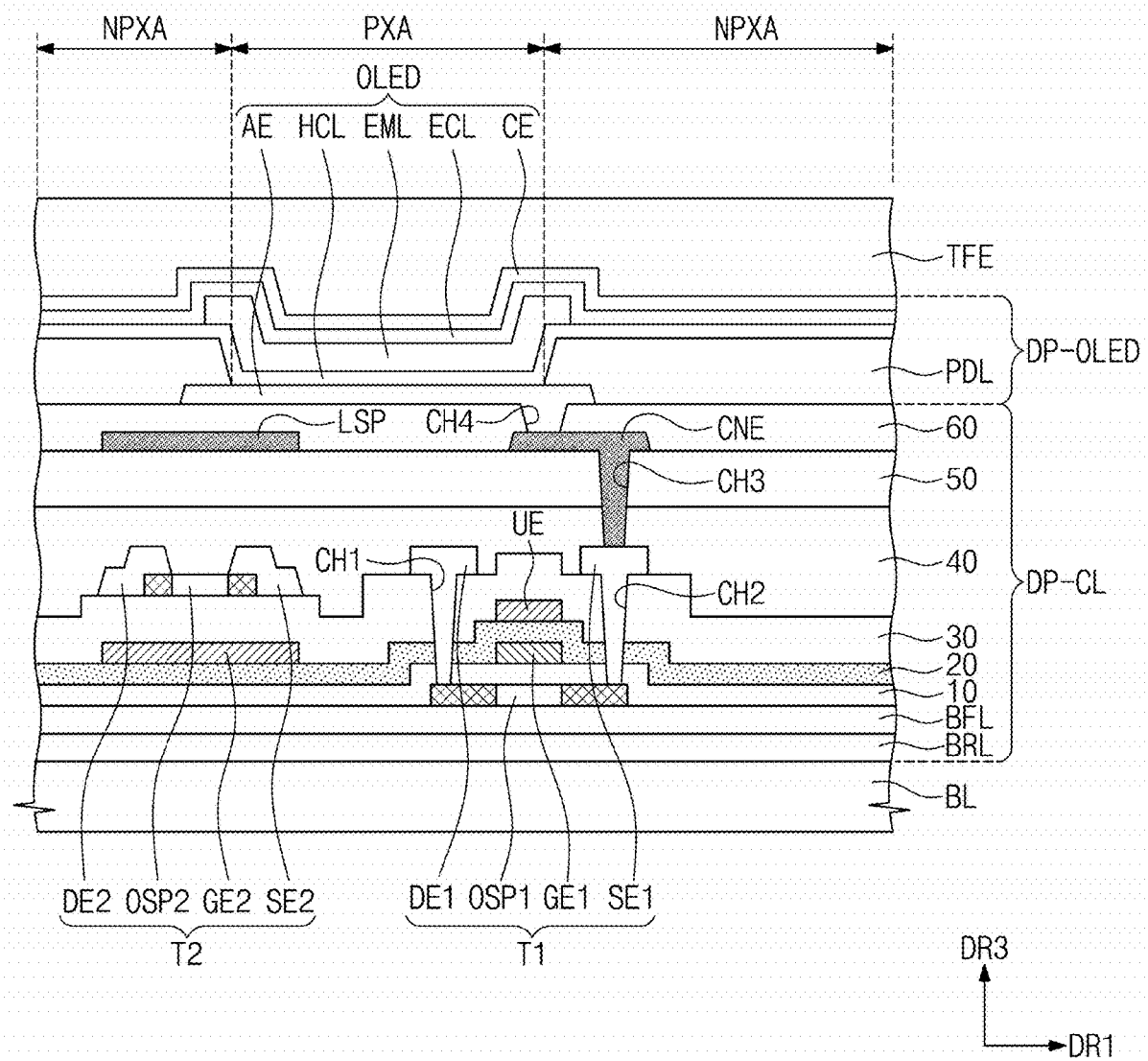
FIG. 6 is a sectional view illustrating a region of a display panel according to an embodiment of the inventive concept.

FIG. 6 is a sectional view illustrating a region of a display panel according to an embodiment of the inventive concept. For convenience in description, a region corresponding to FIG. 3B is illustrated in FIG. 6. For concise description, an element previously described with reference to FIGS. 1A to 5 may be identified by the same reference number without repeating an overlapping description thereof.

As shown in FIG. 6, the display panel DP may further include a light blocking pattern LSP that is provided between the fifth and sixth insulating layers 50 and 60 and overlaps the second semiconductor pattern OSP2.

The light blocking pattern LSP may be formed of or include a material having high absorptivity or high reflectance. The light blocking pattern LSP may be provided over the second semiconductor pattern OSP2 to prevent a fraction (e.g., a reflected fraction) of light that is generated in the organic light emitting diode OLED from being incident into the second semiconductor pattern OSP2.

The light blocking pattern LSP may be formed of or include the same material as that of the connection electrode CNE. For example, the light blocking pattern LSP may be formed of or include a metallic material. The light blocking pattern LSP may have the same stacking structure as the connection electrode CNE. The light blocking pattern LSP and the connection electrode CNE may be simultaneously formed by a single patterning process using the same mask, thereby simplifying the fabrication process and reducing the process cost.

Figure 7E:
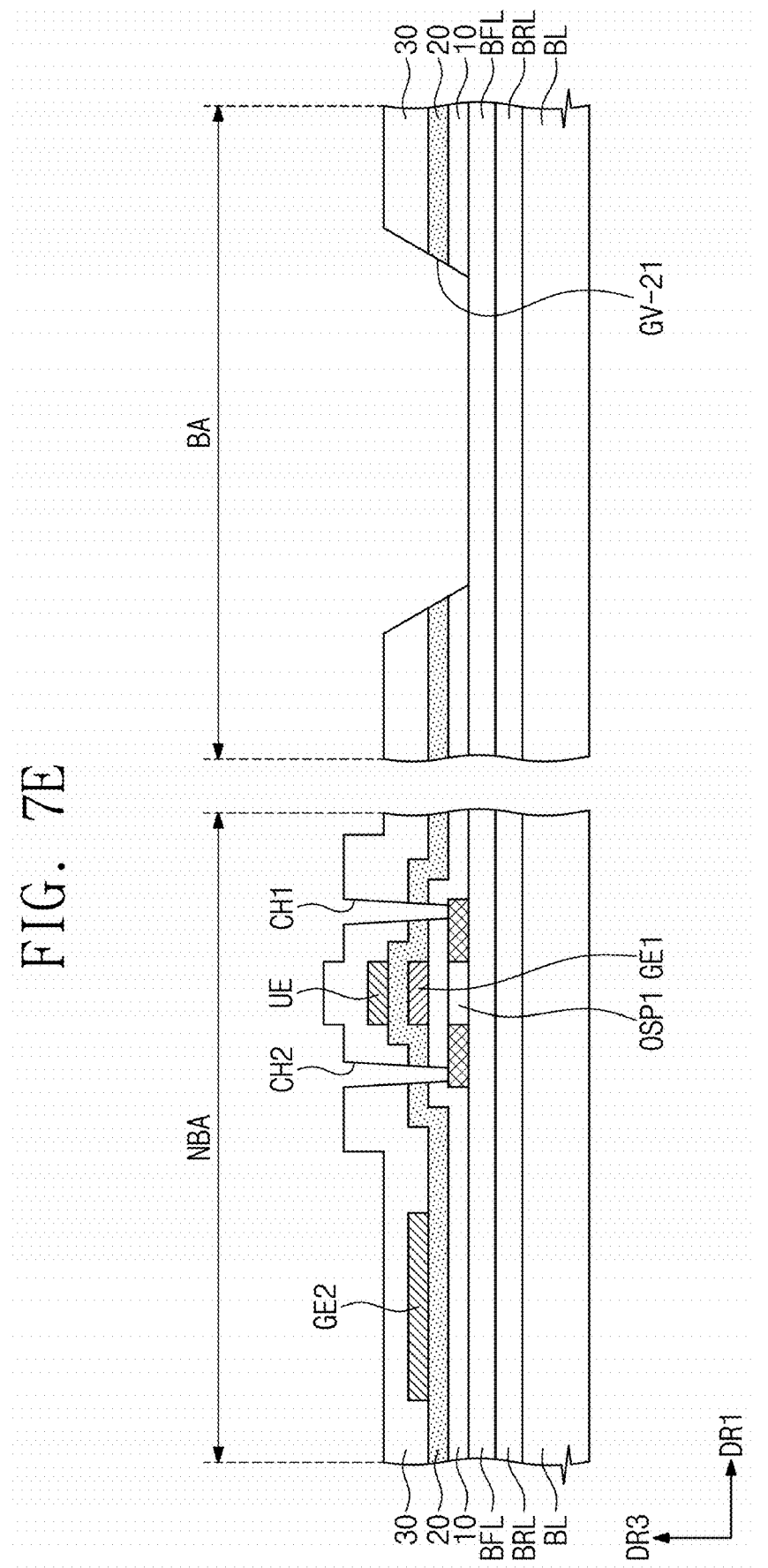
FIGS. 7A to 7Q are sectional views illustrating a process of fabricating a display panel according to an embodiment of the inventive concept.
Figure 7H:
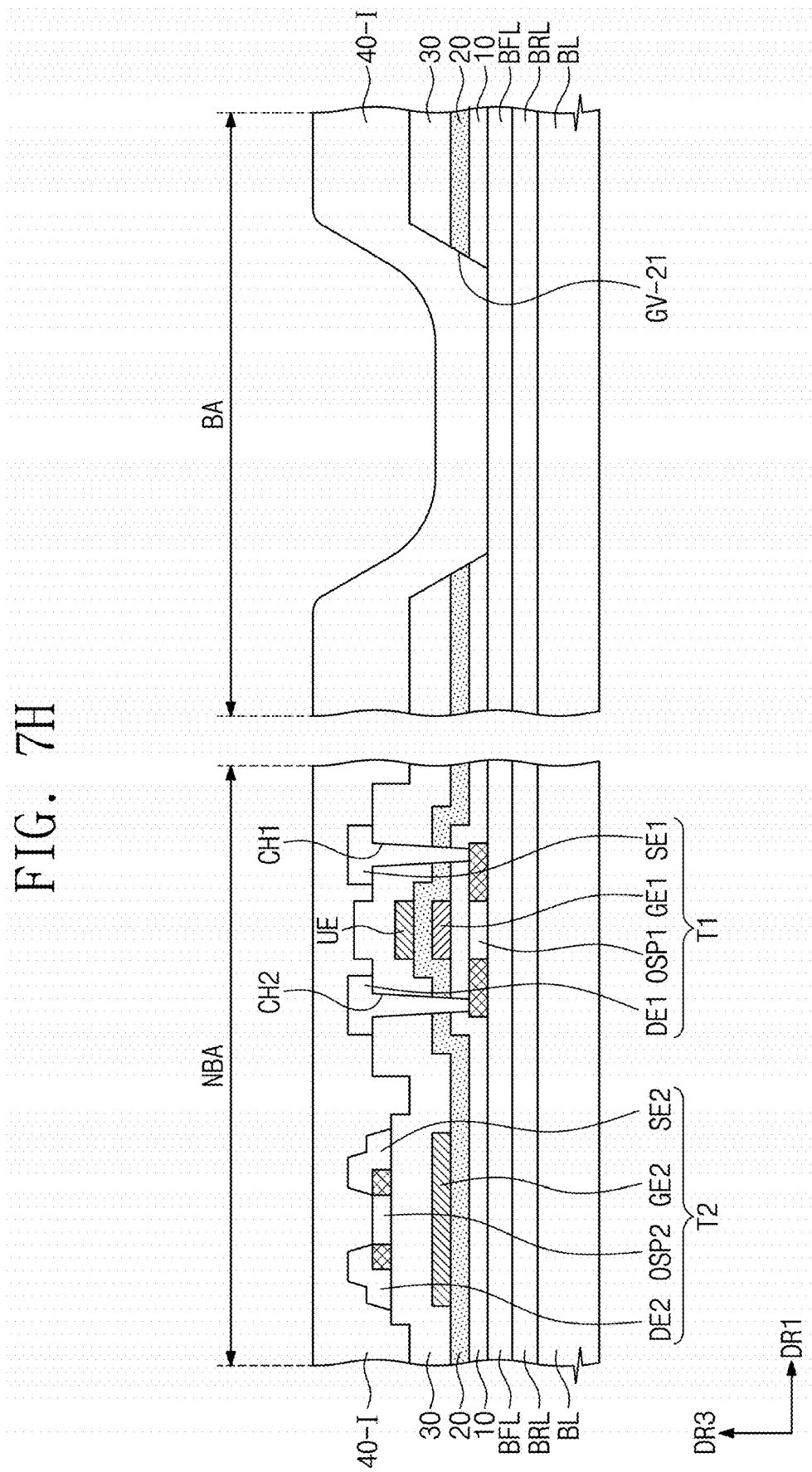
Figure 7I:
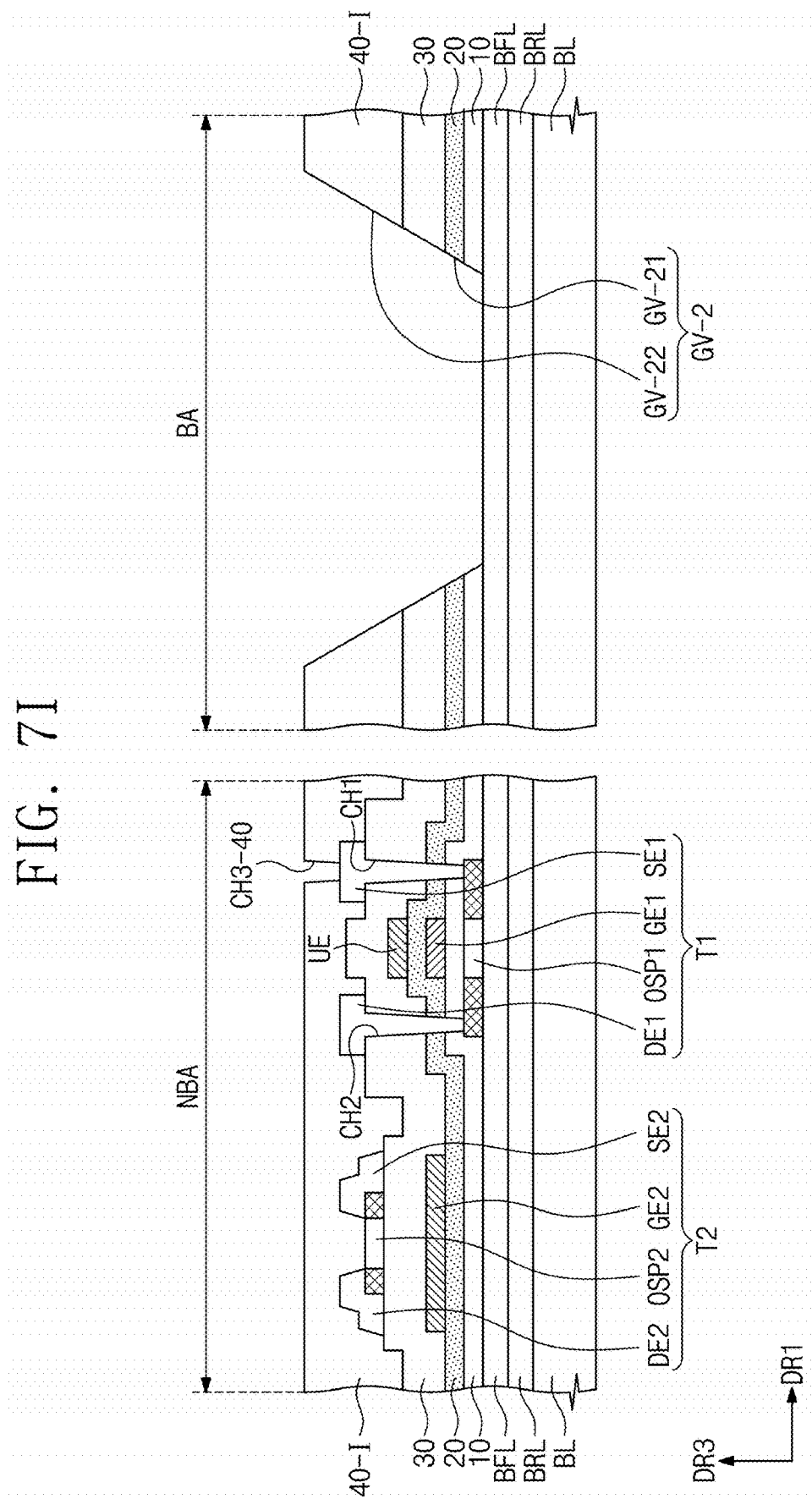
Figure 7J:
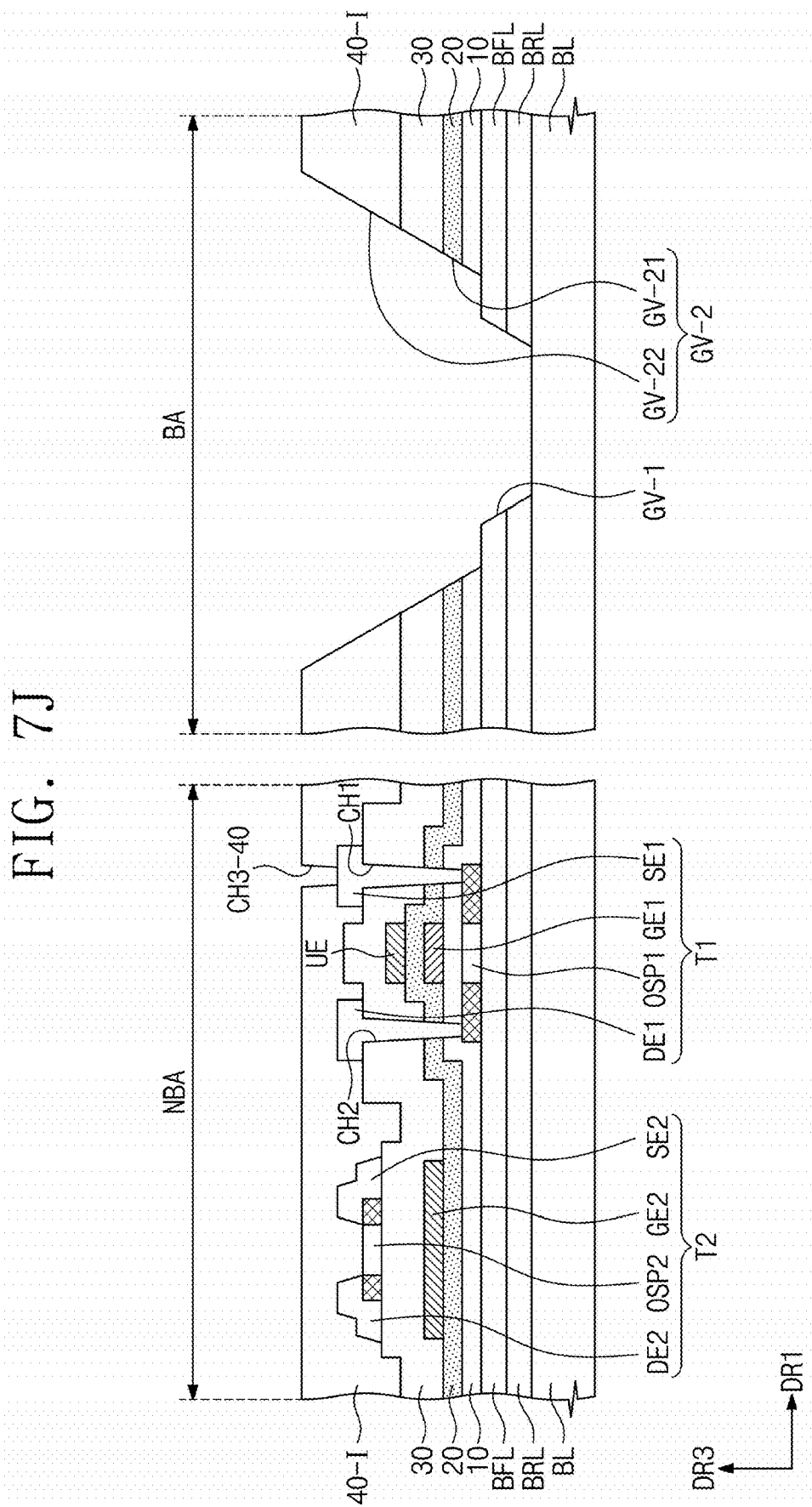
Figure 7K:
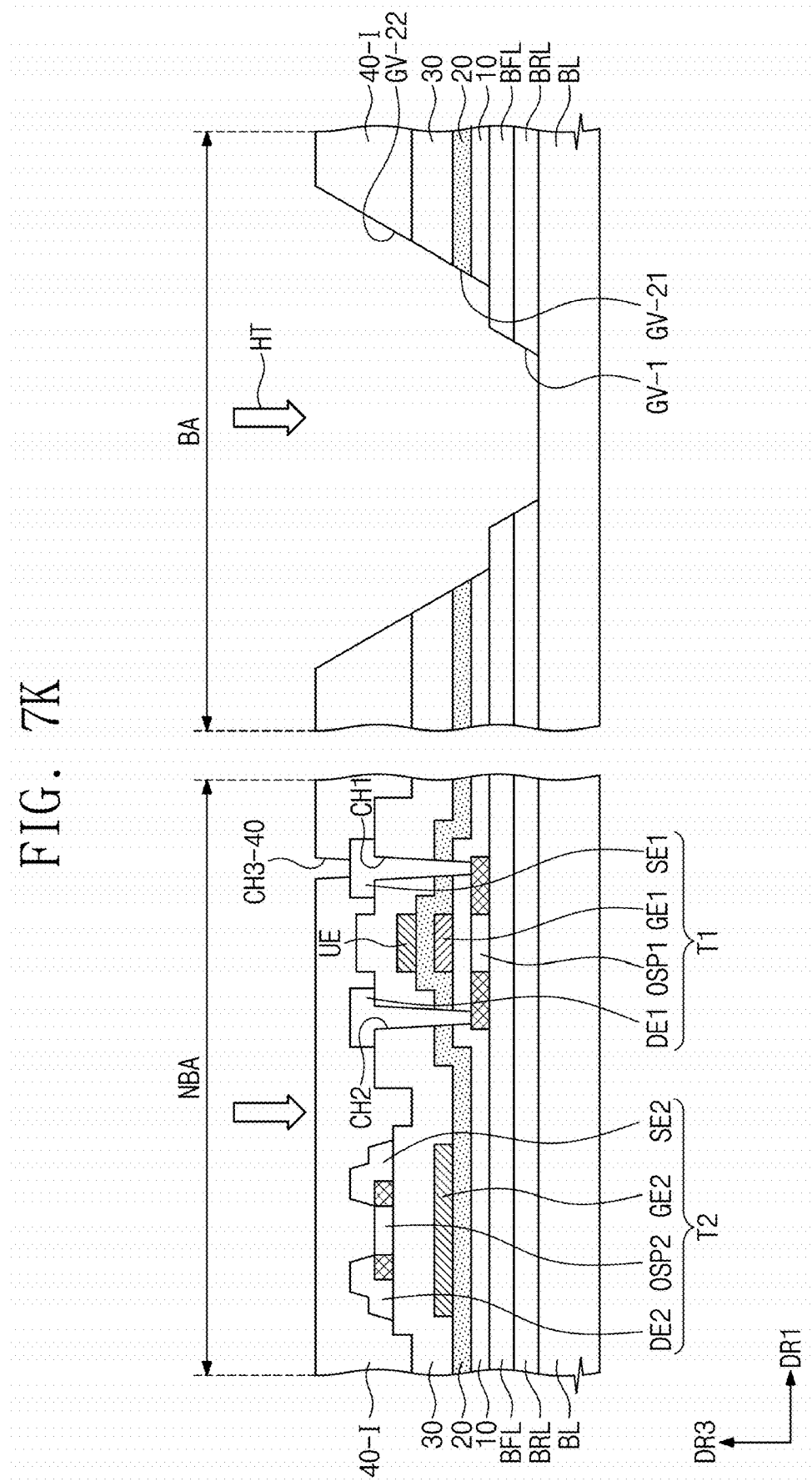
Figure 7L:
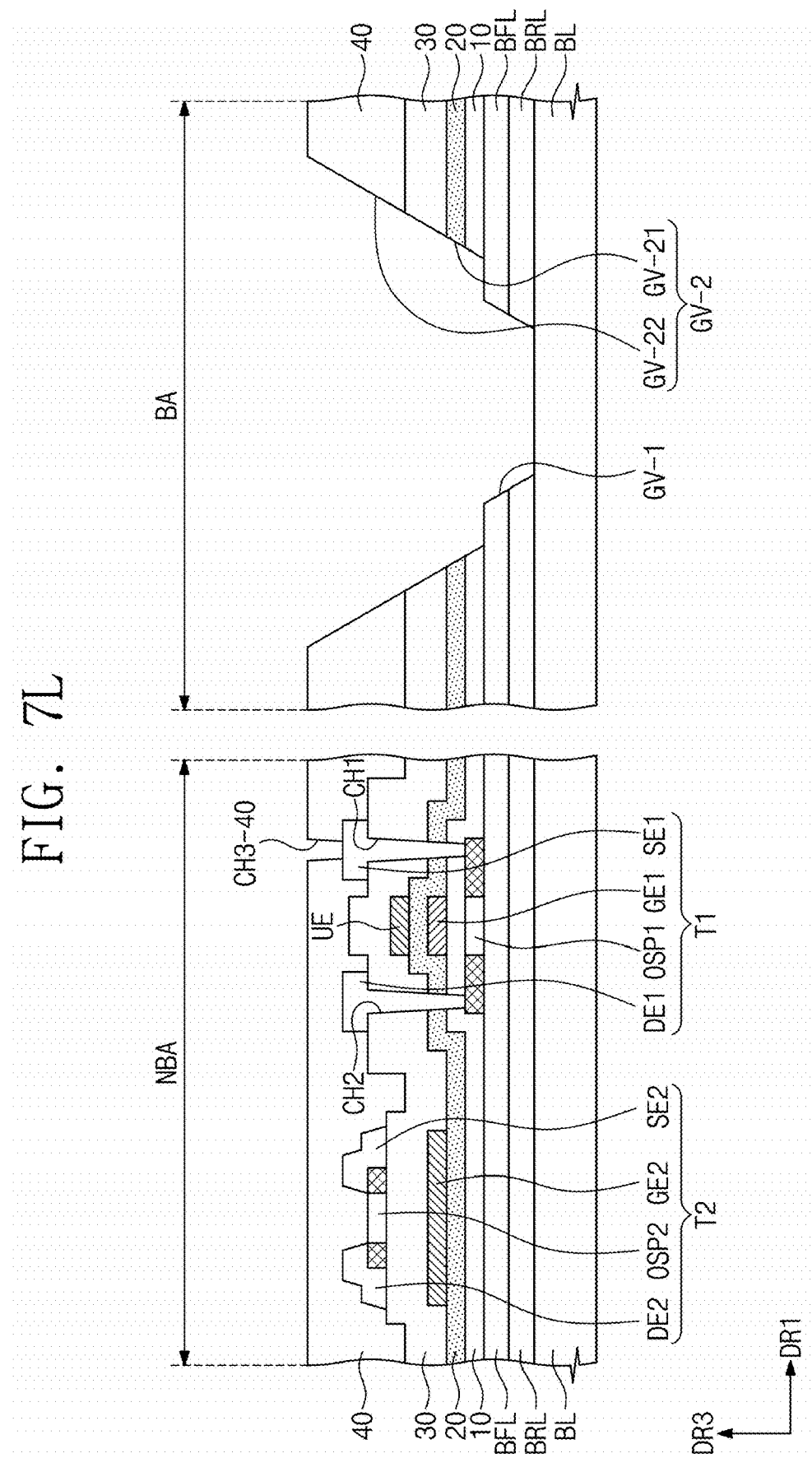
Figure 7M:
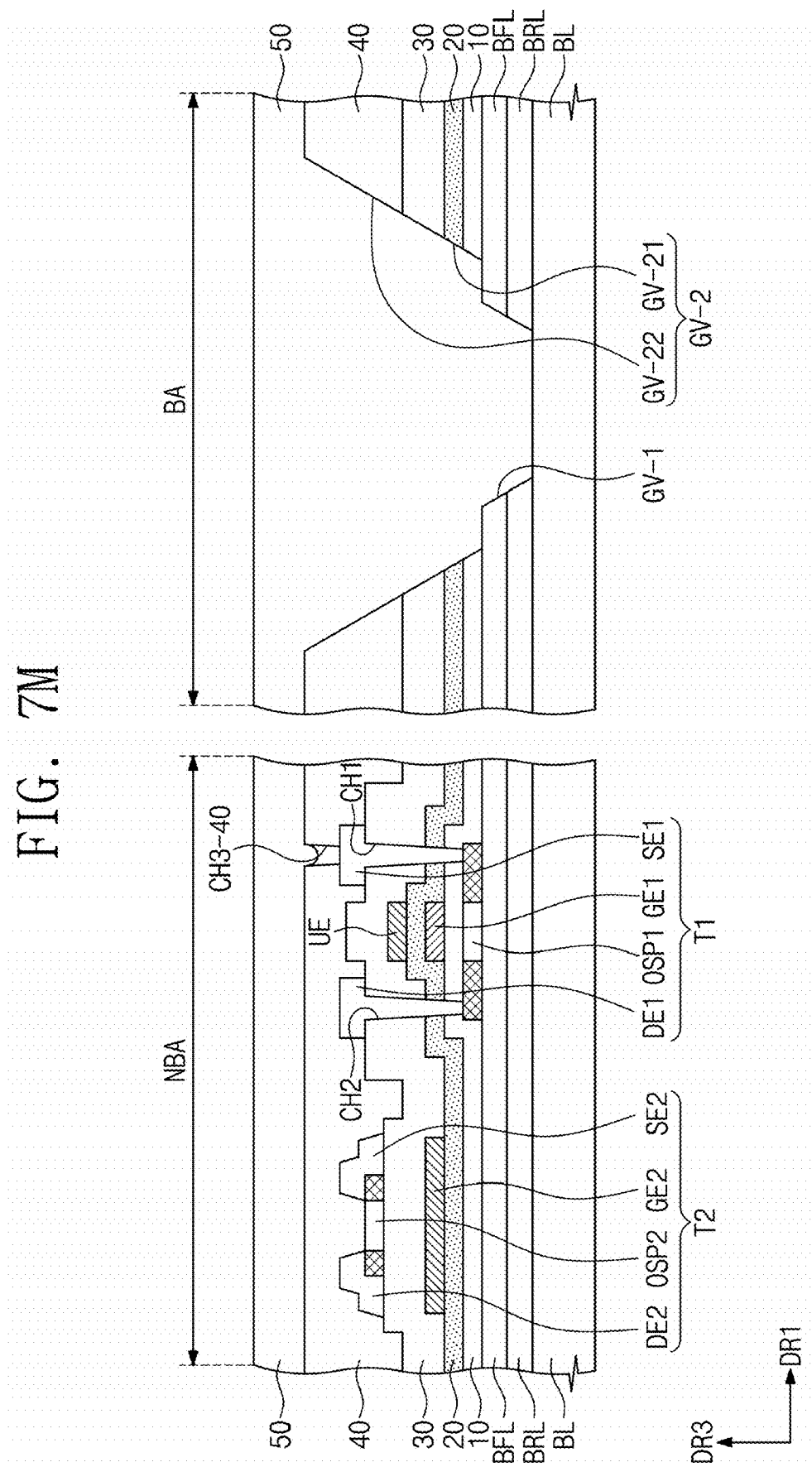
Figure 7N:
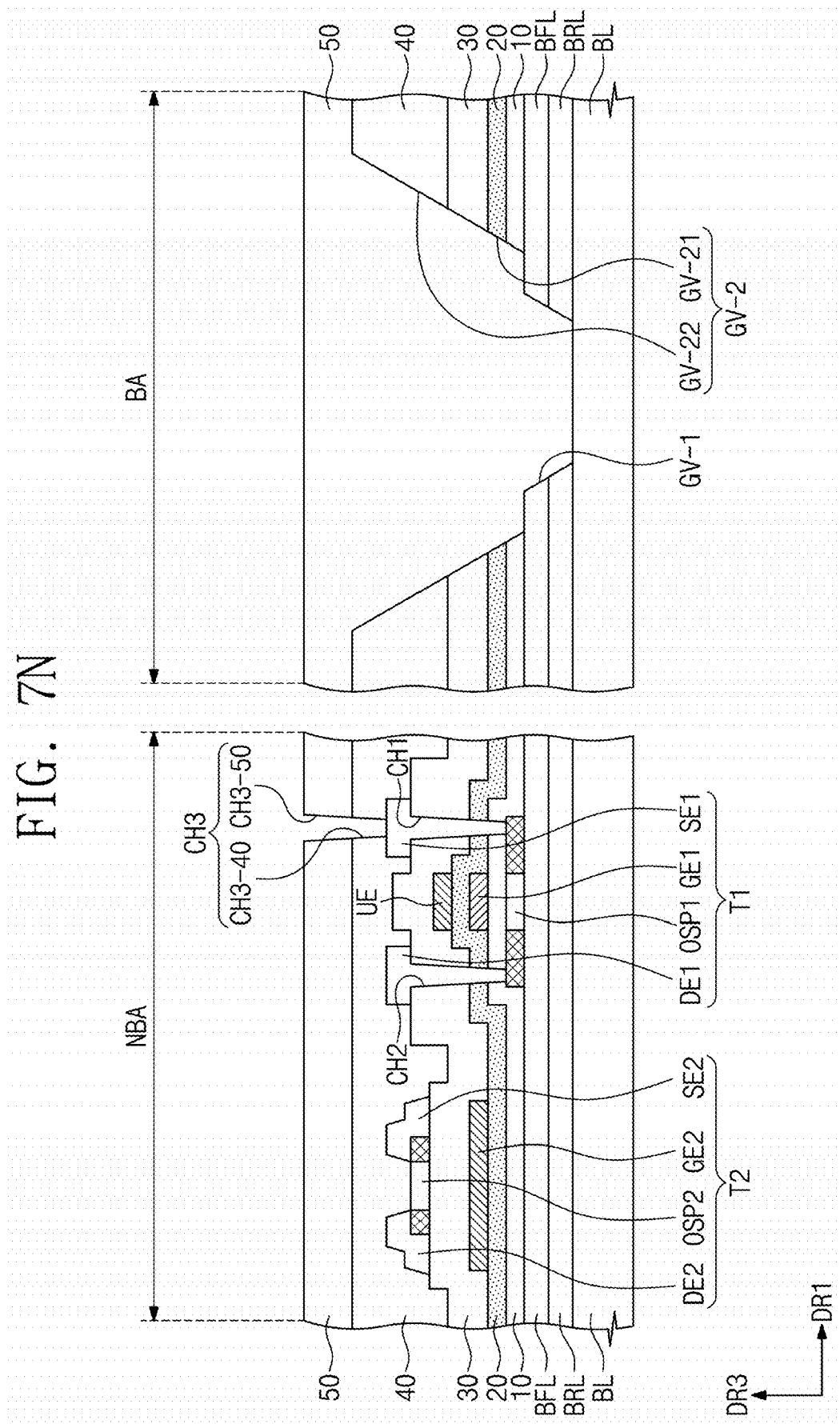
Figure 70:
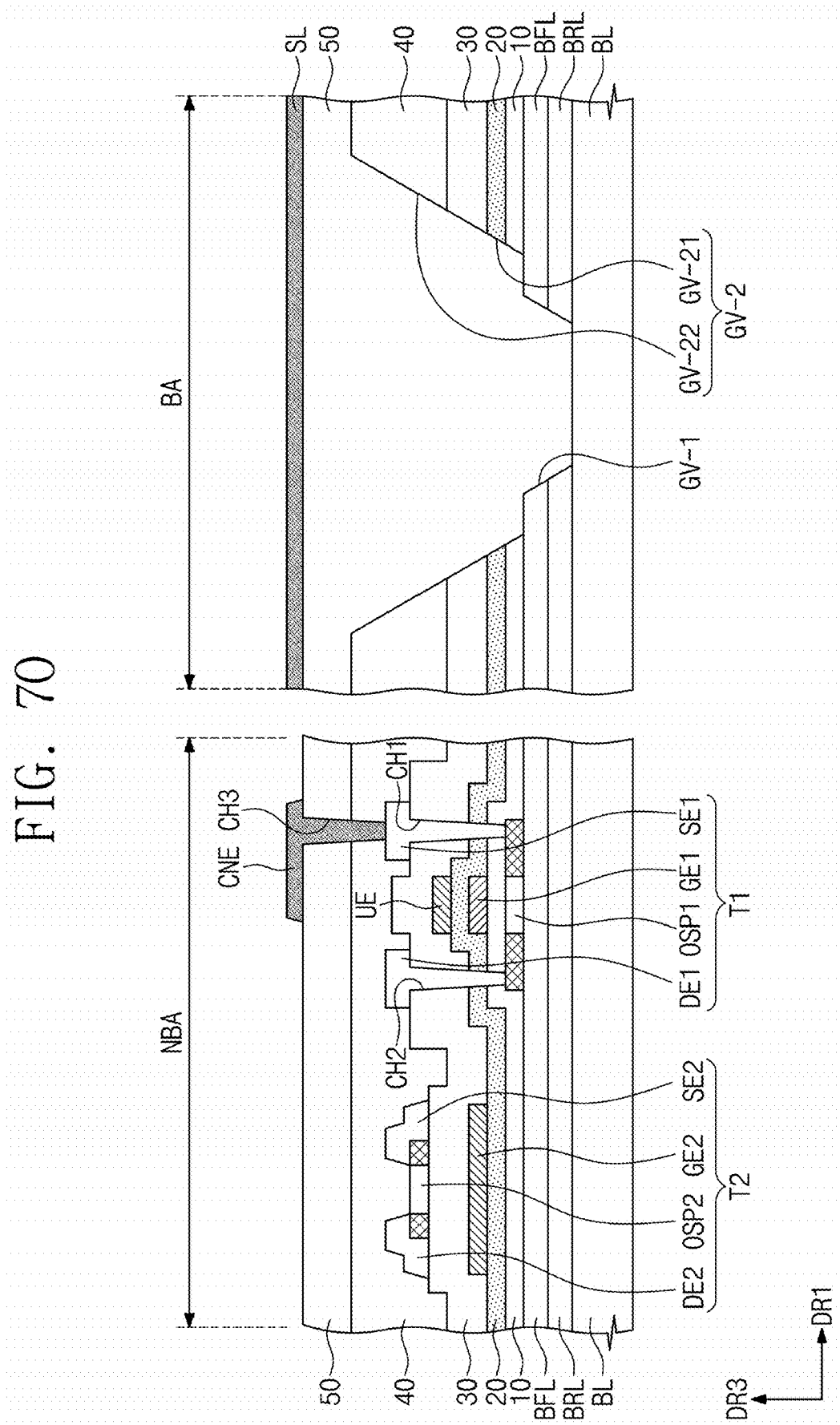
Figure 7P:
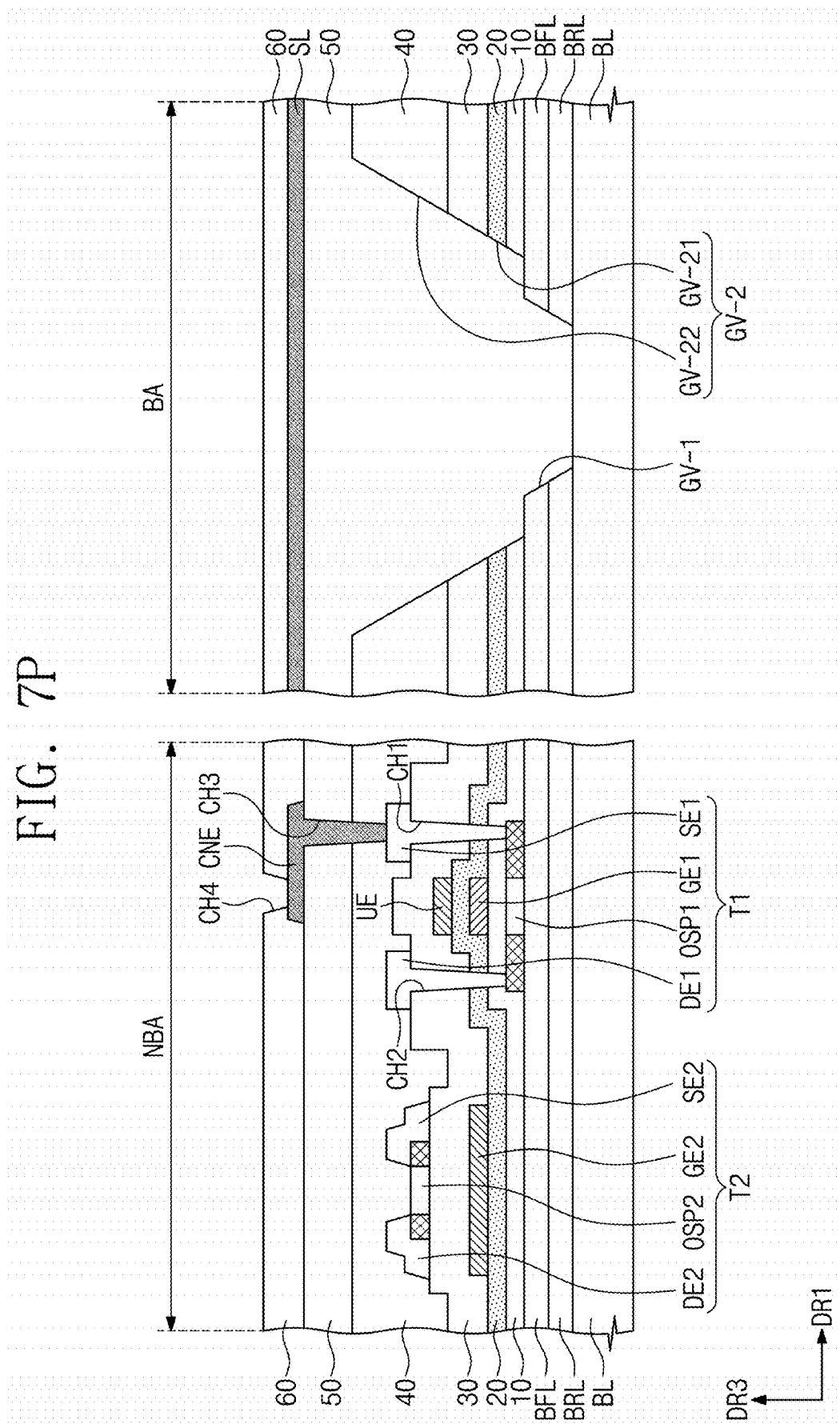
Figure 7Q:
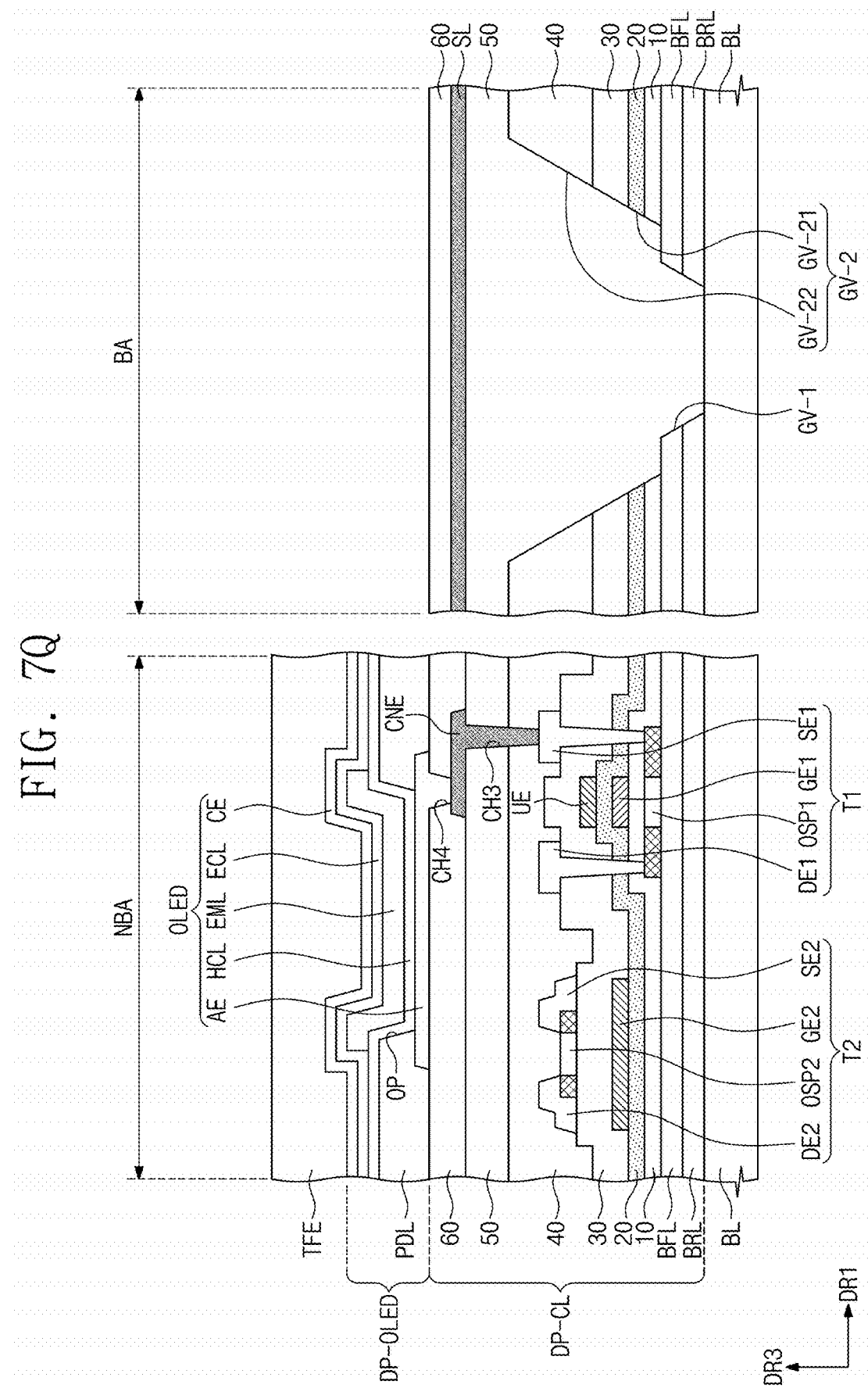

FIGS. 7A to 7Q are sectional views illustrating a process of fabricating a display panel according to an embodiment of the inventive concept. For comparison, two regions corresponding to FIGS. 3B and 4A are illustrated in each of FIGS. 7A to 7Q. For concise description, an element previously described with reference to FIGS. 1A to 6 may be identified by the same reference number without repeating an overlapping description thereof.

As shown in FIG. 7A, at least one inorganic layer may be formed on the base layer BL. The at least one inorganic layer may overlap both of the non-bending region NBA and the bending region BA. Although not shown, during the fabrication process, the base layer BL may be placed on a working substrate. The working substrate may be removed after the fabrication of the display panel.

The at least one inorganic layer may be formed by depositing, coating, or printing an inorganic material on the base layer BL. In an embodiment, the at least one inorganic layer may include the barrier layer BRL and the buffer layer BFL, as shown in FIG. 7A. The formation of the barrier layer BRL may include sequentially forming a silicon oxide layer and a silicon nitride layer on the base layer BL. The formation of the buffer layer BFL may include sequentially forming a silicon oxide layer and a silicon nitride layer on the barrier layer BRL.

As shown in FIG. 7A, a first preliminary semiconductor pattern OSP1-P may be formed on the buffer layer BFL. The first preliminary semiconductor pattern OSP1-P may be formed of or include a silicon semiconductor material. The formation of the first preliminary semiconductor pattern OSP1-P may include forming a semiconductor layer and then patterning the semiconductor layer. In an embodiment, the semiconductor layer may be crystalized before or after the patterning of the semiconductor layer.

Thereafter, as shown in FIG. 7B, the first insulating layer 10 may be formed in the non-bending region NBA and the bending region BA to cover the buffer layer BFL and the first preliminary semiconductor pattern OSP1-P. The first insulating layer 10 may be formed by a deposition, coating, or printing process. At least one or each of other insulating layers that will be formed on the first insulating layer 10 may be formed using one of the deposition, coating, and printing processes.

The first control electrode GE1 may be formed on the first insulating layer 10. The formation of the first control electrode GE1 may include forming a conductive layer on the first insulating layer 10 and then patterning the conductive layer. The first capacitor electrode E1 (e.g., see FIG. 3C) of the capacitor Cst may be formed using the same process as that for the first control electrode GE1.

Next, a doping process may be performed on the first preliminary semiconductor pattern OSP1-P using the first control electrode GE1 as a mask. In the doping process, impurities may be injected into the first preliminary semiconductor pattern OSP1-P through the first insulating layer 10, as depicted by the arrow. Here, the impurities may not be injected into a channel region of the first preliminary semiconductor pattern OSP1-P that overlaps the first control electrode GE1, whereas the impurities may be injected into both side regions (i.e., an input region and an output region) of the first preliminary semiconductor pattern OSP1-P that are spaced apart from each other with the channel region interposed therebetween. In an embodiment, the input and output regions of the first preliminary semiconductor pattern OSP1-P may be doped with n-type dopants (e.g., group V elements).

The first semiconductor pattern OSP1 may be formed by doping the first preliminary semiconductor pattern OSP1-P. However, the inventive concept is not limited to the above example, and in certain embodiments, the first semiconductor pattern OSP1 may be formed by doping the first preliminary semiconductor pattern OSP1-P with p-type dopants (e.g., group III elements).

Thereafter, as shown in FIG. 7C, the second insulating layer 20 may be formed in both of the non-bending region NBA and the bending region BA to cover the first insulating layer 10 and the first control electrode GE1. The second control electrode GE2 that does not overlap the first control electrode GE1 may be formed on the second insulating layer 20. For example, when viewed in a plan view, the second control electrode GE2 may be spaced apart from the first control electrode GE1. The second control electrode GE2 and the upper electrode UE may be formed using the same process. Although not shown, the second capacitor electrode E2 (e.g., see FIG. 3C) of the capacitor Cst may be formed by the same process as that for the second control electrode GE2 and the upper electrode UE.

Thereafter, as shown in FIG. 7D, the third insulating layer 30 may be formed in the non-bending region NBA and the bending region BA to cover the second insulating layer 20, the second control electrode GE2, and the upper electrode UE.

Next, as shown in FIG. 7E, a first etching step may be performed to locally remove the first to third insulating layers 10, 20, and 30. For example, the first and second contact holes CH1 and CH2 may be formed to expose at least a portion of the input and output regions of the first semiconductor pattern OSP1, respectively. In an embodiment, the first etching step may be performed to locally remove the first to third insulating layers 10 to 30 in the bending region BA to form a first upper groove GV-21. In an embodiment, the first etching step may use a single mask to form the first and second contact holes CH1 and CH2 on the non-bending region NBA as well as the first upper groove GV-21 on the bending region BA, thereby reducing the number of the mask required to fabricate the display panel.

Thereafter, as shown in FIG. 7F, a second preliminary semiconductor pattern OSP2-P may be formed on the third insulating layer 30. The second preliminary semiconductor pattern OSP2-P may be formed of or include a metal oxide semiconductor material. The formation of the second preliminary semiconductor pattern OSP2-P may include forming a metal oxide semiconductor layer and performing a patterning process on the metal oxide semiconductor layer. In an embodiment, the second preliminary semiconductor pattern OSP2-P may be formed to have a conductive property.

In certain embodiments, the process steps described with reference to FIG. 7E and FIG. 7F may be performed in a different order. For example, the first etching step for forming the first and second contact holes CH1 and CH2 and the first upper groove GV-21 may be performed after the formation of the second preliminary semiconductor pattern OSP2-P.

Next, as shown in FIG. 7G, an electrode formation step may be performed to form electrodes DE1, SE1, SE2, and DE2 on the third insulating layer 30. The formation of the electrodes DE1, SE1, SE2, and DE2 may include forming a conductive layer using a deposition process and performing a patterning process on the conductive layer.

The patterning of the conductive layer may be performed by a plasma process using an etching gas. In an embodiment, the etching gas may include an oxygen-containing material, and in this case, oxygen plasma produced from the etching gas may be used for the plasma process. The etching gas may be used to reduce a concentration of hydrogen in a region of the second preliminary semiconductor pattern OSP2-P that is not veiled by the second input electrode DE2 and the second output electrode SE2. Thus, the unveiled region of the second preliminary semiconductor pattern OSP2-P that is located between the second input electrode DE2 and the second output electrode SE2 may have an electrical resistance that is higher than that of the veiled regions of the second preliminary semiconductor pattern OSP2-P that are located under the second input electrode DE2 and the second output electrode SE2. For example, the unveiled region of the second preliminary semiconductor pattern OSP2-P may be changed to have a semiconductor-like band structure, thereby serving as a channel region. That is, by treating the second preliminary semiconductor pattern OSP2-P having the conductive property with the etching gas, the second semiconductor pattern OSP2 that has at least a portion of the semiconductor-like band structure may be formed. The second semiconductor pattern OSP2 may include the channel region that has the semiconductor-like band structure, and the input and output regions that are spaced apart from each other with the channel region interposed therebetween.

Thereafter, as shown in FIG. 7H, a preliminary fourth insulating layer 40-I may be formed in both of the non-bending region NBA and the bending region BA to cover the third insulating layer 30 and the electrodes DE1, SE1, SE2, and DE2. The preliminary fourth insulating layer 40-I may include a portion filling at least a portion of the first upper groove GV-21.

Next, as shown in FIG. 7I, a second etching step may be performed to partially remove the preliminary fourth insulating layer 40-I. The second etching step may be performed to form a contact hole CH3-40 that penetrates through the preliminary fourth insulating layer 40-I and exposing at least a portion of the first output electrode SE1.

In an embodiment, the second etching step may partially remove the preliminary fourth insulating layer 40-I in the bending region BA and thereby forming a second upper groove GV-22. In an embodiment, the second etching step may use a single mask to form the contact hole CH3-40 in the non-bending region NBA as well as the second upper groove GV-22 in the bending region BA, thereby reducing the number of the mask required to fabricate the display panel.

As shown in FIG. 7I, the second upper groove GV-22 and the first upper groove GV-21 may be formed to have inner side surfaces aligned to each other, but the inventive concept is not limited thereto. For example, as shown in FIG. 5, the third groove GV-3 may be formed in the preliminary fourth insulating layer 40-I to expose at least a portion of the top surface of the third insulating layer 30.

As shown in FIG. 7J, a third etching step may be performed to partially remove the inorganic layers BRL and BFL in the bending region BA. For example, in the third etching step, an etching gas may be used to partially remove the barrier layer BRL and the buffer layer BFL in the bending region BA and thereby forming the first groove GV-1 in the bending region BA. A top surface of inorganic layers including the barrier layer BRL and the buffer layer BFL may be partially exposed depending on an etching time or an etchant. In certain embodiments, the first groove GV-1 may be formed to have an inner side surface aligned to that of the first upper groove GV-21.

In an embodiment, the third etching step for forming the first groove GV-1 and the second etching step for forming the second upper groove GV-22 may be performed in a successive manner. The third etching step and the second etching step may constitute a single process that is performed using the same mask, but may differ from each other in terms of an exposure time to an etching gas or a material of the etching gas. Thus, the number of masks used in the etching process may be reduced, thereby simplifying the fabrication process, and reducing the fabrication cost.

As shown in FIGS. 7K and 7L, after the second etching step, the fourth insulating layer 40 may be formed by performing a thermal treatment HT on the preliminary fourth insulating layer 40-I. The thermal treatment HT may be performed to thermally cure the channel region of the second semiconductor pattern OSP2 that is covered with the preliminary fourth insulating layer 40-I. A stress may be exerted on the channel region of the second semiconductor pattern OSP2, when a conductive layer to be used as the second input electrode DE2 and the second output electrode SE2 is deposited, for example, by a physical deposition process. In an embodiment, the thermal treatment HT may stably cure defects that may have been formed in the channel region of the second semiconductor pattern OSP2. Furthermore, the thermal treatment HT may be performed to prevent hydrogen atoms in the preliminary fourth insulating layer 40-I from flowing into the channel region of the second semiconductor pattern OSP2.

In an embodiment, the thermal treatment HT may be performed at a high temperature of about 300° C. or higher. The thermal treatment HT may include an annealing process that is gradually performed for a specific process time. According to an embodiment of the inventive concept, the fabrication method of the display panel may further include the thermal treatment HT to be performed after the formation of the preliminary fourth insulating layer 40-I to improve reliability of the second semiconductor pattern OSP2 and stabilize electric characteristics of the second thin-film transistor T2.

Next, as shown in FIG. 7M, the fifth insulating layer 50 may be formed on the fourth insulating layer 40. The fifth insulating layer 50 may be formed to overlap the non-bending region NBA and the bending region BA. The fifth insulating layer 50 may include a portion that is provided in the first groove GV-1 and the second groove GV-2. The fifth insulating layer 50 may be formed to partially fill the contact hole CH3-40.

In an embodiment, the fifth insulating layer 50 may be formed, after the thermal treatment step on the fourth insulating layer 40. In a case where the fifth insulating layer 50 is formed of a polymer resin such as polyimide, the fifth insulating layer 50 may be damaged during the thermal treatment HT. According to an embodiment of the inventive concept, a step of forming a layer containing an organic material (e.g., the fifth insulating layer 50) may be postponed until the thermal treatment HT on the fourth insulating layer 40 is finished to prevent the fifth insulating layer 50 from being damaged by the thermal treatment HT, and thereby improving reliability of the fabrication process.

As shown in FIG. 7N, a fourth etching step may be performed to remove a portion of the fifth insulating layer 50. For example, a contact hole CH3-50 may be formed in the fifth insulating layer 50 to expose at least a portion of the first output electrode SE1 that is covered with the fifth insulating layer 50. The contact hole CH3-50 of the fifth insulating layer 50 may be aligned to the contact hole CH3-40 of the fourth insulating layer 40. The contact holes CH3-40 and CH3-50 may be connected to each other to form a single contact hole that is defined as the third contact hole CH3.

As shown in FIG. 7O, the connection electrode CNE may be formed on the fifth insulating layer 50. The process of forming the connection electrode CNE may also be used to form the portion of the signal line SL that overlaps the bending region BA. As described above, the connection electrode CNE and the signal line SL may be two parts of a single object or may be two separate objects that are spaced apart from each other, but the inventive concept is not limited thereto.

As shown in FIG. 7P, the sixth insulating layer 60 may be formed on the fifth insulating layer 50 to cover not only the connection electrode CNE but also the portion of the signal line SL that overlaps the bending region BA. The fourth contact hole CH4 may be formed in the sixth insulating layer 60 to expose at least a portion of the top surface of the connection electrode CNE.

As shown in FIG. 7Q, the organic light emitting diode OLED may be formed on the sixth insulating layer 60 in the non-bending region NBA. The first electrode AE may be formed on the sixth insulating layer 60 and may be connected to the connection electrode CNE through the fourth contact hole CH4. The pixel definition layer PDL may be formed on the sixth insulating layer 60 to expose a center portion of the first electrode AE. A preliminary pixel definition layer may be formed on the sixth insulating layer 60 and may be patterned to form the pixel definition layer PDL with the opening OP.

Thereafter, the hole control layer HCL, the light-emitting pattern EML, the electron control layer ECL, and the second electrode CE may be sequentially formed in the non-bending region NBA of the pixel definition layer PDL. The hole control layer HCL, the light-emitting pattern EML, the electron control layer ECL, and the second electrode CE may overlap at least the display region DP-DA (e.g., see FIG. 2), when viewed in a plan view.

The encapsulation layer TFE may be formed on the second electrode CE. As for the encapsulation layer TFE, an organic encapsulation layer and/or an inorganic encapsulation layer may be formed by a deposition or inkjet printing process. The encapsulation layer TFE may be formed in the non-bending region NBA and may not be formed in the bending region BA, but the inventive concept is not limited thereto.

Figure 8A:
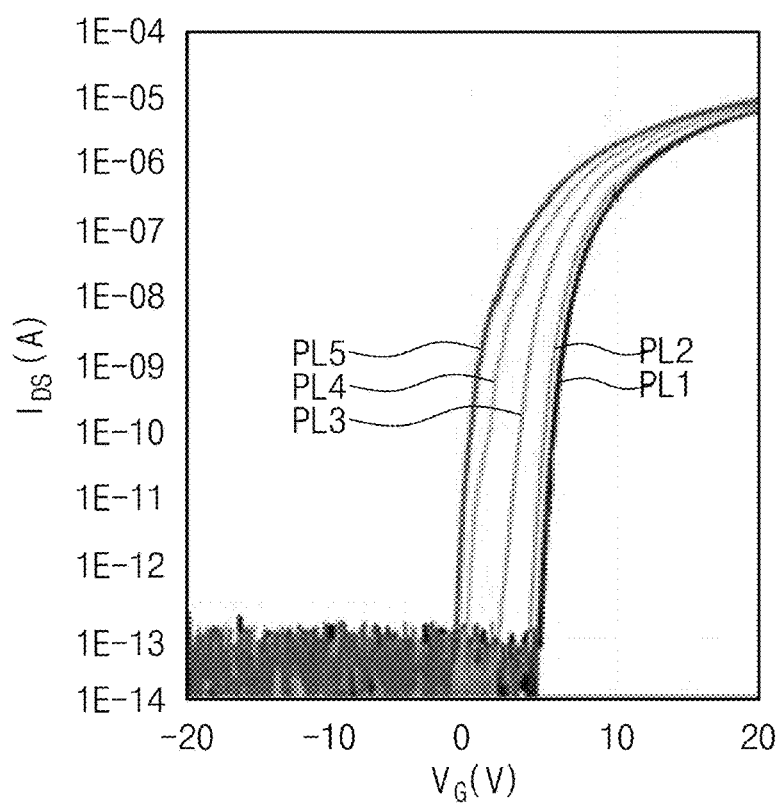
FIG. 8A is a graph showing current-voltage characteristics of a thin-film transistor according to a comparative example.
Figure 8B:
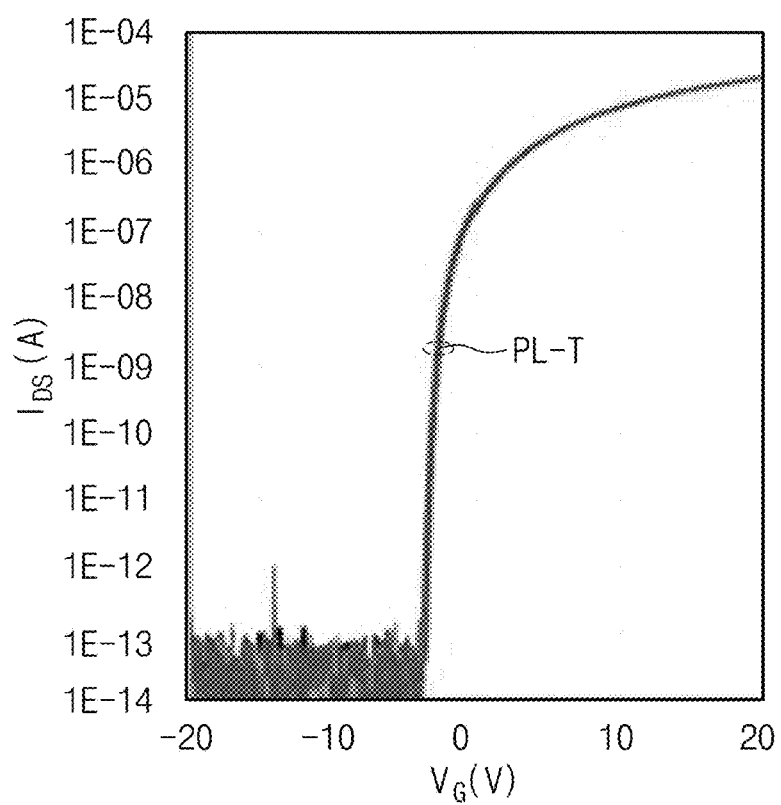
FIG. 8B is a graph showing current-voltage characteristics of a thin-film transistor according to an embodiment of the inventive concept.

FIG. 8A is a graph showing current-voltage characteristics of a thin-film transistor according to a comparative example, and FIG. 8B is a graph showing current-voltage characteristics of a thin-film transistor according to an embodiment of the inventive concept. FIG. 8A is a graph showing current-voltage characteristics of a thin-film transistor that has been treated by a thermal treatment at a relatively low temperature (e.g., 300° C. or lower), and FIG. 8B is a graph showing current-voltage characteristics of a thin-film transistor (e.g., the second thin-film transistor T2 described with reference to FIG. 3B) that is treated by a thermal treatment at a relatively high temperature according to an embodiment of the inventive concept. In FIGS. 8A and 8B, the voltage $V_G$ represents a gate voltage applied to a gate electrode of a thin-film transistor, and the current IDs represents an amount of electric current flowing through a channel region of the thin-film transistor applied with the gate voltage. The thin-film transistors for FIGS. 8A and 8B have been fabricated to have substantially the same features and structure, except for a difference in process temperature in the thermal treatment step. For convenience in illustration, curves measured from each thin-film transistor at different times are plotted in FIGS. 8A and 8B. Hereinafter, the inventive concept will be described in more detail with reference to FIGS. 8A and 8B.

In the comparative example of FIG. 8A, the thermal treatment step on the thin-film transistor is performed at a low temperature (e.g., of 300° C. or lower or of about 250° C.) that may be too low to cause damage to the fifth insulating layer 50. First to fifth curves PL1, PL2, PL3, PL4, and PL5 in FIG. 8A are sequentially measured at different times. For the thin-film transistor according to the comparative example, as shown in FIG. 8A, as the process time is increased, the curve gradually moves leftward (i.e., from the first graph PL1 to the fifth graph PL5). A difference in a threshold voltage between the first curve PL1 showing an initial current-voltage property and the fifth curve PL5 showing the lastly-measured current-voltage property is about −5.68V. That is, in a case where, as in the comparative example, the thin-film transistor is not treated at a sufficiently high temperature, the thin-film transistor may suffer from poor uniformity in electric characteristics and a short life.

By contrast, the current-voltage graph of FIG. 8B is obtained from a thin-film transistor including a semiconductor pattern that is thermally treated at a temperature of about 380° C. As shown in FIG. 8B, current-voltage curves that are measured from the thin-film transistor at different times converge to a single indistinguishable curve PL-T.

In FIG. 8B, a difference in a threshold voltage between the curve showing an initial current-voltage property and the curve showing the lastly-measured current-voltage property is about −0.20V. This shows that the thin-film transistor according to an embodiment of the inventive concept has an invariant current-voltage property or uniform electric characteristics. According to an embodiment of the inventive concept, since the organic layer (e.g., the fifth insulating layer 50 of FIG. 3B) is formed after the formation of the fourth insulating layer 40 to thermally treat the fourth insulating layer 40 at a high temperature of 300° C. or higher while preventing the fifth insulating layer 50 from being damaged. Thus, the thin-film transistor can be fabricated to have improved electric characteristics and a longer life. Furthermore, the method according to an embodiment of the inventive concept may stably provide a display panel with high reliability and improved electric characteristics.

Figure 9:
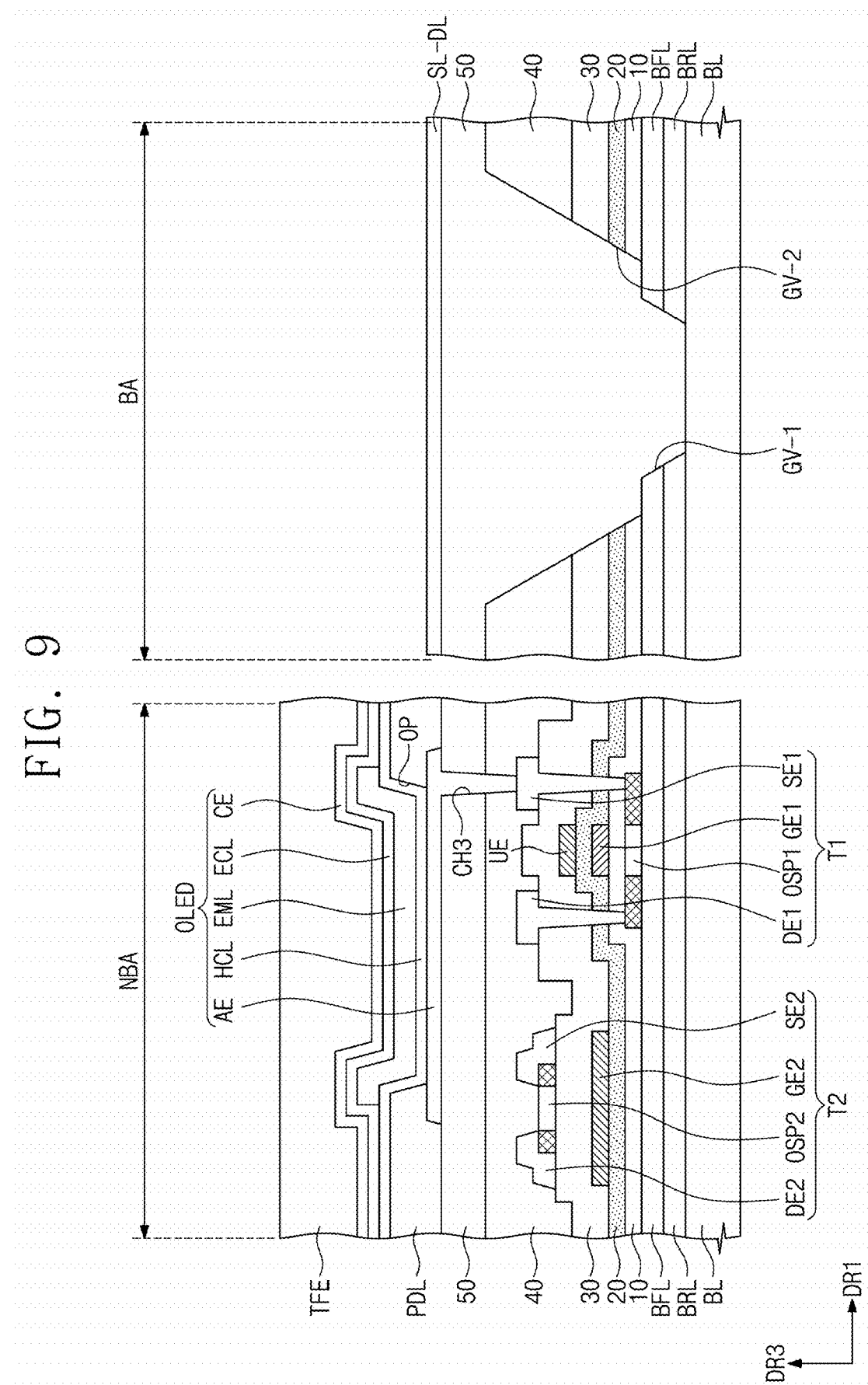
FIG. 9 is a sectional view illustrating a portion of a display panel according to an embodiment of the inventive concept.

FIG. 9 is a sectional view illustrating a portion of a display panel according to an embodiment of the inventive concept. For convenience in description, a region corresponding to FIG. 7Q is illustrated in FIG. 9. Hereinafter, an embodiment of the inventive concept will be described in more detail with reference to FIG. 9. For concise description, an element previously described with reference to FIGS. 1A to 8B may be identified by the same reference number without repeating an overlapping description thereof.

In the display panel shown in FIG. 9, the connection electrode CNE and the sixth insulating layer 60 may be omitted. Accordingly, the first electrode AE may be directly provided on the fifth insulating layer 50 and may be connected to the first output electrode SE1 through the third contact hole CH3. A signal line SL-DL may include a portion that overlaps the bending region BA and is directly provided on the fifth insulating layer 50.

The portion of the signal line SL-DL that overlaps the bending region BA may be formed by the same process as that for the first electrode AE. The portion of the signal line SL-DL that overlaps the bending region BA and the first electrode AE may include the same material and may have the same layer structure.

FIGS. 10A to 10D are sectional views illustrating a method of fabricating a display panel according to an embodiment of the inventive concept. In order to avoid redundancy, some of the steps described with reference to FIGS. 7A to 7Q are illustrated in FIGS. 10A to 10D. Hereinafter, an embodiment of the inventive concept will be described in more detail with reference to FIGS. 10A to 10D. For concise description, an element previously described with reference to FIGS. 1A to 9 may be identified by the same reference number without repeating an overlapping description thereof.

Figure 10A:
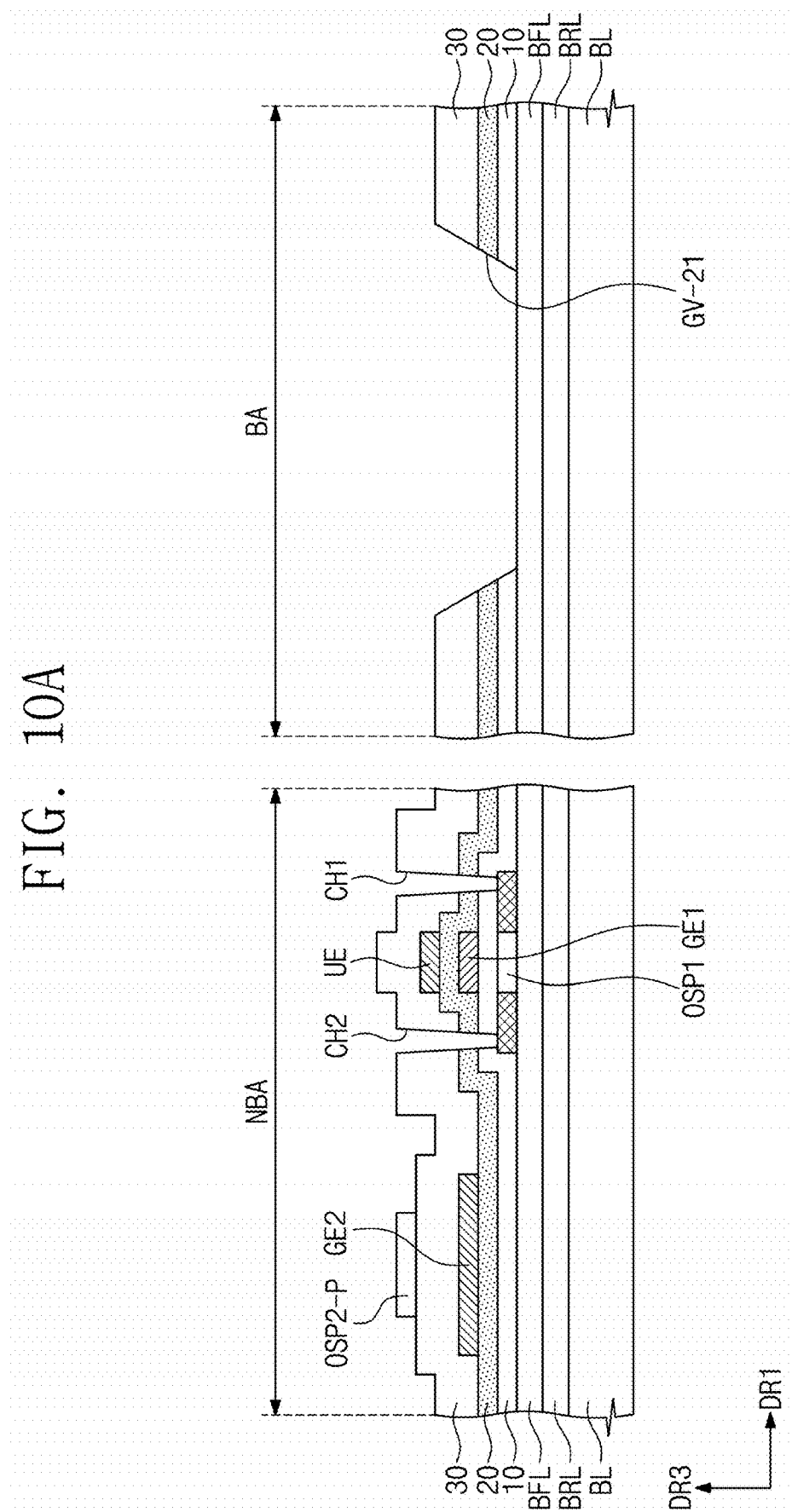

As shown in FIG. 10A, the second preliminary semiconductor pattern OSP2-P and the contact holes CH1 and CH2 may be formed in the non-bending region NBA of the base layer BL, and the first upper groove GV-21 may be formed in the bending region BA. The structure of FIG. 10A may substantially correspond to that of FIG. 7F. For convenience in description, the aforesaid technical features may be omitted below.

Figure 10C:
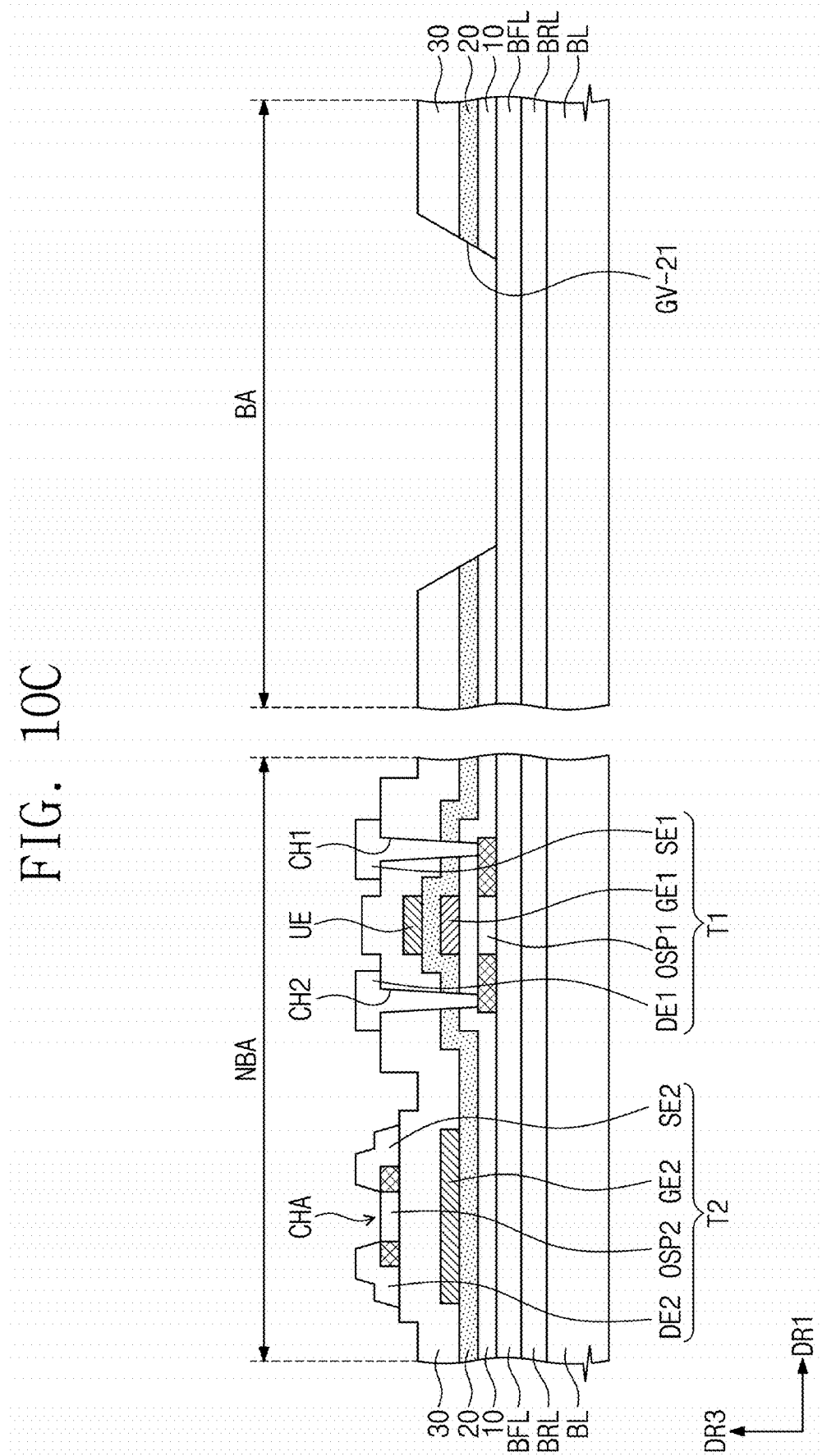

Thereafter, as shown in FIGS. 10B and 10C, a conductive layer CLL may be formed on the third insulating layer 30, and the conductive layer CLL may be patterned using an etching gas ET to form the electrodes DE1, SE1, DE2, and SE2. The conductive layer CLL may be formed to cover the top surface of the third insulating layer 30 and the top surface of the second preliminary semiconductor pattern OSP2-P. The conductive layer CLL may also be formed to fill the contact holes CH1 and CH2 and at least a portion of the first upper groove GV-21.

The etching gas ET may contain a material capable of etching at least a portion of the conductive layer CLL. The etching gas ET may react with exposed regions of the conductive layer CLL that are not veiled by a mask (not shown), and thus, the exposed regions of the conductive layer CLL may be removed. Other regions of the conductive layer CLL veiled by the mask may not be etched, thereby forming the electrodes DE1, SE1, DE2, and SE2.

In an embodiment, the etching gas ET may not contain a chlorine compound. As an example, the etching gas ET may contain a fluoro compound containing fluorine (F). For example, the etching gas ET may contain sulfur hexafluoride ($SF_6$) or hexafluoro butyne ($C_4F_6$).

In a case where the fluoro compound is used, the second semiconductor pattern OSP2 containing an oxide semiconductor material may have a relatively slow etch rate, compared to a case where the chlorine compound is used. For example, in a case where the fluoro compound is used in the etching process, the conductive layer CLL may have a higher etch rate than that of the second semiconductor pattern OSP2. The conductive layer CLL may be formed of or include, for example, molybdenum (Mo).

If the conductive layer CLL contains titanium (Ti) to etch the conductive layer CLL, an etching gas containing a chlorine compound may be used. The oxide semiconductor material may have a relatively high etch rate, when the chlorine compound is used in the etching process. Accordingly, in a case where the etching gas containing the chlorine compound is used to pattern the conductive layer CLL, the second semiconductor pattern OSP2 containing the oxide semiconductor material may be easily damaged.

According to an embodiment of the inventive concept, the etching gas ET may be chosen to contain the fluoro compound to prevent the exposed regions of the second semiconductor pattern OSP2 from being damaged by the etching process for forming the electrodes DE1, SE1, DE2, and SE2 and stably form the second semiconductor pattern OSP2.

Figure 10D:
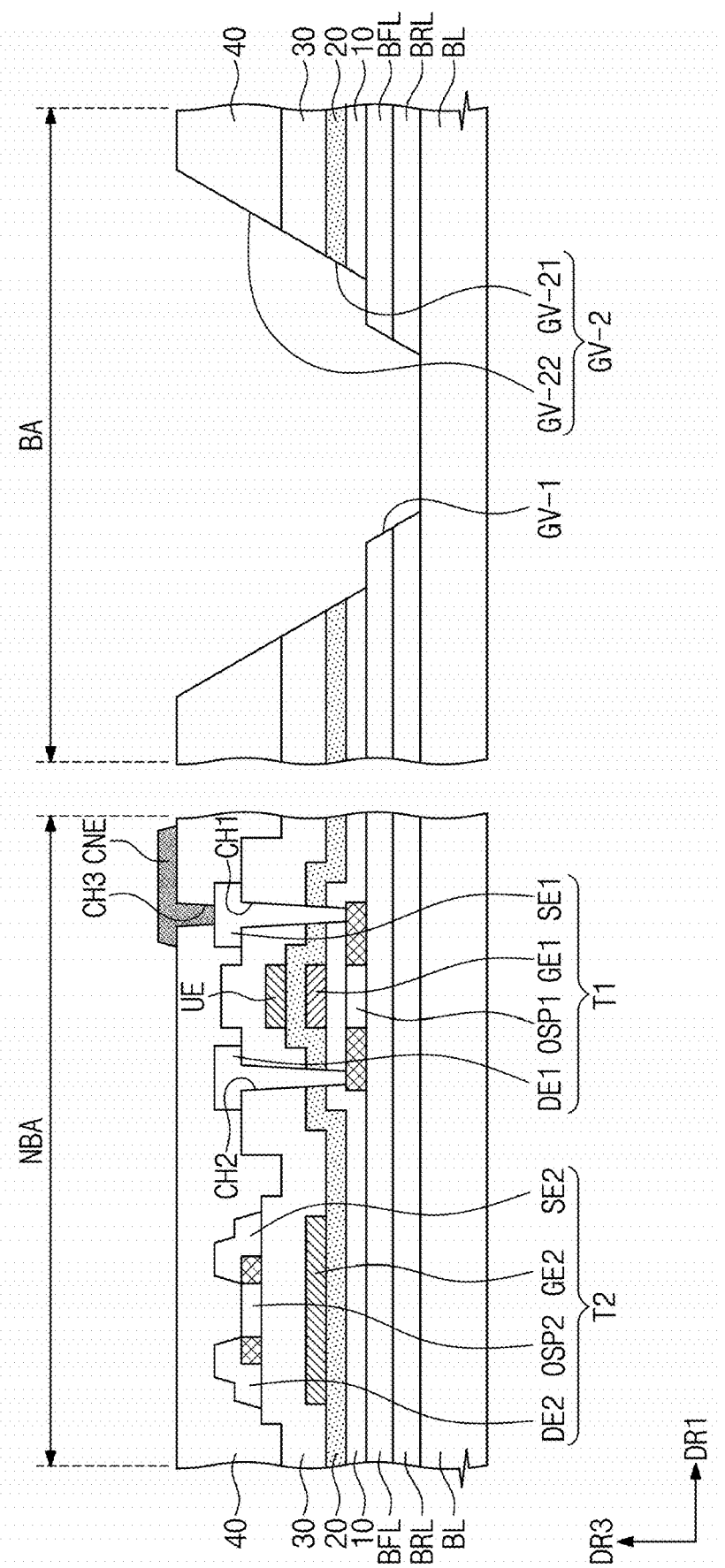

As shown in FIG. 10D, the third contact hole CH3 may be formed in the fourth insulating layer 40, and the connection electrode CNE may be formed to be connected to the first output electrode SE1. For convenience in illustration, the connection electrode CNE is illustrated to be provided on the fourth insulating layer 40, but the inventive concept is not limited thereto.

Since the connection electrode CNE is formed after the formation of the fourth insulating layer 40, the connection electrode CNE may be prevented from being affected by the etching gas ET of FIG. 10B. In addition, the connection electrode CNE may be independently formed, regardless of the formation of the second semiconductor pattern OSP2 or other elements. For example, the connection electrode CNE may be patterned, without a concern of damaging other elements, and thus, a material for the connection electrode CNE may be freely chosen.

In an embodiment, the connection electrode CNE may be formed of or include a material whose electric resistance is lower than the first output electrode SE1. In this case, the first output electrode SE1 and the second output electrode SE2 is formed using same material. Due to the mutually dependent relationship between the first output electrode SE1 and the second semiconductor pattern OSP2, there may be a restriction in a material for the first output electrode SE1, and this may lead to deterioration in electric characteristics of the display device. However, the connection electrode CNE having the low electric resistance may be used to improve the electric characteristics of the display device. For example, the connection electrode CNE may allow the organic light emitting diode OLED (e.g., see FIG. 3B) and the first thin-film transistor T1 to be connected to each other with a low contact resistance to realize a display panel having improved electric characteristics.

According to an embodiment of the inventive concept, in a process of fabricating a semiconductor device, in which semiconductor patterns having different characteristics are provided, a thermal treatment may be performed without causing a damage of an organic layer, thereby improving electric characteristics of the semiconductor pattern and reliability of the fabrication process. Furthermore, the organic layer may be provided at a position that is not affected by a thermal treatment, so that a display panel with a highly-reliable long-time thin-film device may be realized.

While example embodiments of the inventive concept have been particularly shown and described, it will be understood by one of ordinary skill in the art that variations in form and detail may be made therein without departing from the spirit and scope of the attached claims.

What is claimed is:

1. A display panel, comprising:
    a base layer including a first region and a second region that is bent from the first region along a predetermined bending axis;
    a first thin-film transistor provided in the first region, the first thin-film transistor comprising a crystalline silicon semiconductor pattern, a first control electrode, and a first input electrode and a first output electrode that are coupled to the crystalline silicon semiconductor pattern and are spaced apart from each other with the first control electrode interposed therebetween;
    a second thin-film transistor disposed in the first region, the second thin-film transistor comprising a second control electrode, an oxide semiconductor pattern disposed on the second control electrode, and a second input electrode and a second output electrode that are in contact with the oxide semiconductor pattern and are spaced apart from each other;
    a first inorganic layer disposed to overlap the first thin-film transistor and the second thin-film transistor in a thickness direction, and to include a first groove that overlaps the second region;
    a second inorganic layer disposed between first thin-film transistor and the second thin-film transistor and the base layer, to include a second groove that overlaps the first groove:
    an organic layer disposed in the first region and the second region to cover inner surfaces of the first and second grooves; and
    an organic light emitting diode disposed on the organic layer and in the first region and electrically connected to the first thin-film transistor,
    wherein the second inorganic layer is disposed to expose a portion of a top surface of the base layer, and the organic layer is disposed to be in contact with the portion of the top surface of the base layer.

2. The display panel of claim 1, wherein the second input electrode and the second output electrode comprise molybdenum.

3. The display panel of claim 1, further comprising:
    an upper organic layer disposed between the organic layer and the organic light emitting diode; and
    a connection electrode disposed between the upper organic layer and the organic layer and coupled to each of the organic light emitting diode and the first output electrode,
    wherein the connection electrode comprises a material that is different from that of the first output electrode.

4. The display panel of claim 3, wherein the connection electrode comprises a material whose resistance is lower than that of the first output electrode.

5. The display panel of claim 3, further comprising a signal line disposed in the second region and overlapping the first groove and the second groove,
    wherein the signal line is disposed on the same layer as the connection electrode.

6. The display panel of claim 1, further comprising a pixel definition layer disposed on the organic layer and including an opening,
    wherein the organic light emitting diode is disposed in the opening, and
    wherein the pixel definition layer overlaps the first region and the second region and comprises an organic material.

7. The display panel of claim 6, wherein the pixel definition layer further comprises a recessed portion on an inner surface of the opening.

8. The display panel of claim 1, further comprising a signal line that is disposed in the second region and overlapping the first groove and the second groove,
    wherein the signal line is disposed on the same layer as the second output electrode.

9. The display panel of claim 8, wherein the signal line comprises a plurality of patterns that are disposed in the second region and are spaced apart from each other in a direction crossing the bending axis.

10. The display panel of claim 1, wherein the first inorganic layer is in contact with the oxide semiconductor pattern.

* * * * *